(12) United States Patent
Baars et al.

(10) Patent No.: US 8,835,245 B2
(45) Date of Patent: Sep. 16, 2014

(54) SEMICONDUCTOR DEVICE COMPRISING SELF-ALIGNED CONTACT ELEMENTS

(75) Inventors: Peter Baars, Dresden (DE); Till Schloesser, Dresden (DE); Frank Jakubowski, Dresden (DE); Andy Wei, Dresden (DE); Richard Carter, Dresden (DE); Matthias Schaller, Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 145 days.

(21) Appl. No.: 13/372,604

(22) Filed: Feb. 14, 2012

(65) Prior Publication Data

US 2012/0211837 A1    Aug. 23, 2012

(30) Foreign Application Priority Data

Feb. 17, 2011  (DE) .......................... 10 2011 004 323

(51) Int. Cl.
| | |
|---|---|
| *H01L 21/8234* | (2006.01) |
| *H01L 21/768* | (2006.01) |
| *H01L 21/285* | (2006.01) |
| *H01L 29/66* | (2006.01) |
| *H01L 29/78* | (2006.01) |

(52) U.S. Cl.
CPC .. *H01L 21/823475* (2013.01); *H01L 21/76816* (2013.01); *H01L 21/28518* (2013.01); *H01L 21/76895* (2013.01); *H01L 29/66636* (2013.01); *H01L 21/823437* (2013.01); *H01L 21/76897* (2013.01); *H01L 29/7848* (2013.01)

USPC .......................................... 438/233; 257/532

(58) Field of Classification Search
None
See application file for complete search history.

(56) References Cited

U.S. PATENT DOCUMENTS

| | | | |
|---|---|---|---|
| 6,072,221 A * | 6/2000 | Hieda ............................ | 257/382 |
| 7,745,275 B2 | 6/2010 | Yeric et al. | |
| 8,084,344 B2 * | 12/2011 | Lee et al. ....................... | 438/586 |
| 2003/0008496 A1 * | 1/2003 | Deleonibus .................... | 438/630 |
| 2003/0119243 A1 * | 6/2003 | Shin et al. ...................... | 438/200 |
| 2004/0007727 A1 | 1/2004 | Song | |
| 2008/0200034 A1 * | 8/2008 | Lin et al. ........................ | 438/700 |
| 2010/0052075 A1 | 3/2010 | Yeh et al. | |
| 2010/0123250 A1 * | 5/2010 | Schulz et al. .................. | 257/773 |
| 2010/0270627 A1 * | 10/2010 | Chang et al. ................... | 257/411 |
| 2010/0285658 A1 * | 11/2010 | Yeh et al. ....................... | 438/586 |
| 2011/0241166 A1 * | 10/2011 | Chumakov ..................... | 257/532 |
| 2011/0281426 A1 * | 11/2011 | Kim et al. ...................... | 438/586 |
| 2012/0025382 A1 * | 2/2012 | Riess et al. ..................... | 257/751 |
| 2013/0178033 A1 * | 7/2013 | Bohr et al. ..................... | 438/299 |

OTHER PUBLICATIONS

Translation of Official Communication from German Patent Application No. 10 2011 004 323.3 dated Dec. 10, 2012.

\* cited by examiner

*Primary Examiner* — Whitney T Moore
*Assistant Examiner* — Joseph Galvin, III
(74) *Attorney, Agent, or Firm* — Amerson Law Firm, PLLC

(57) ABSTRACT

When forming sophisticated semiconductor devices, a replacement gate approach may be applied in combination with a self-aligned contact regime by forming the self-aligned contacts prior to replacing the placeholder material of the gate electrode structures.

20 Claims, 30 Drawing Sheets

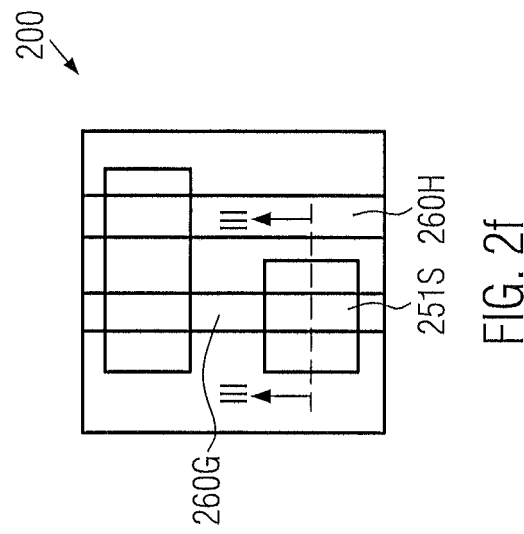
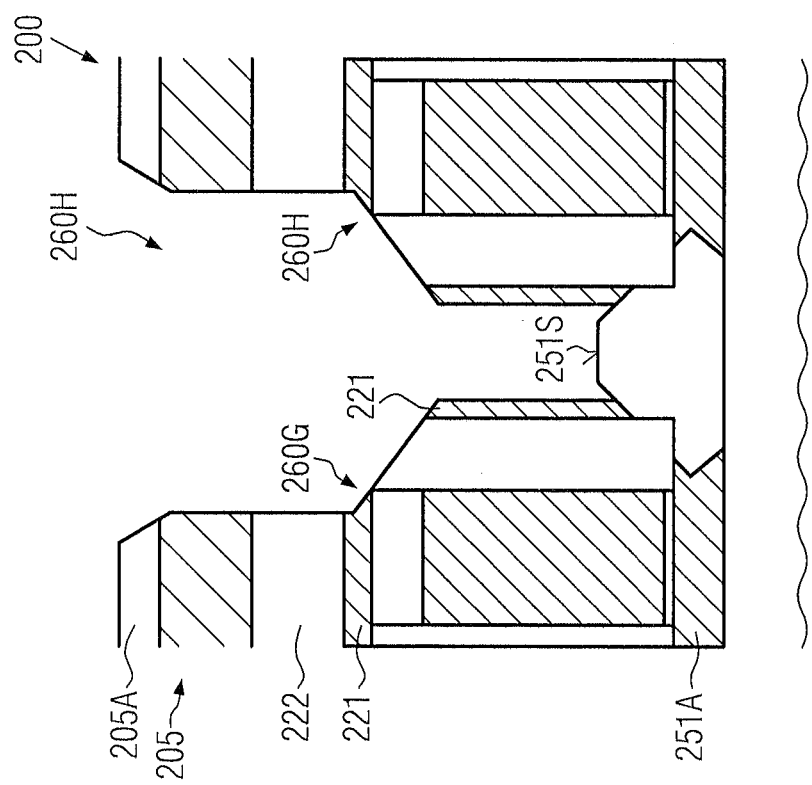

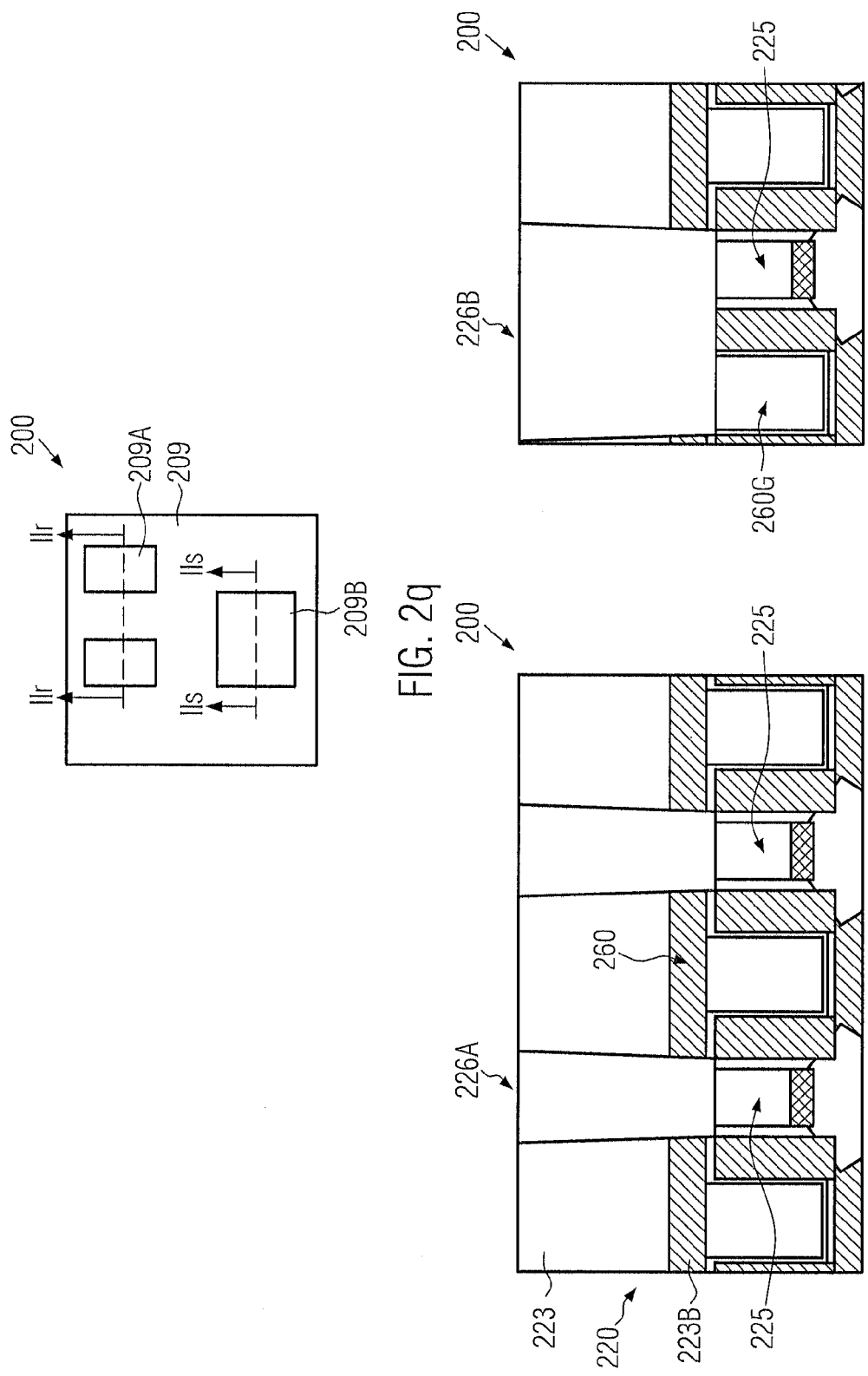

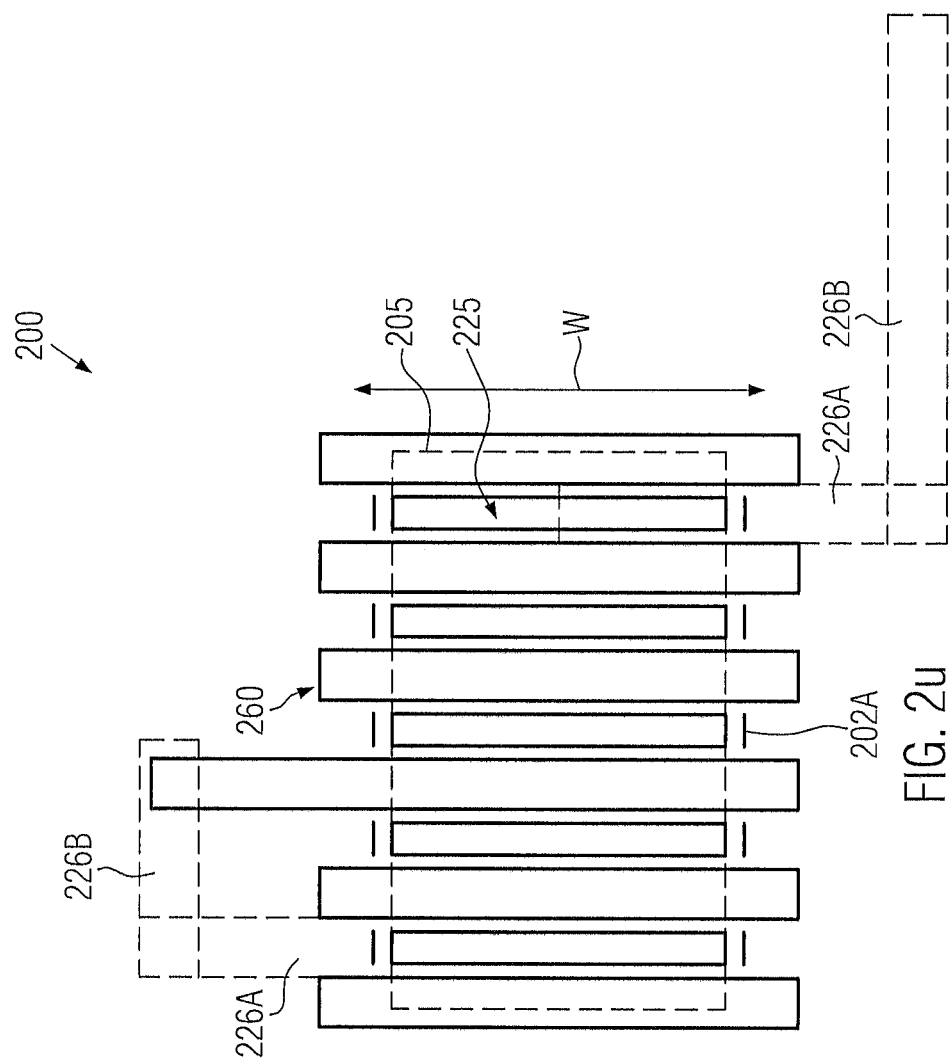

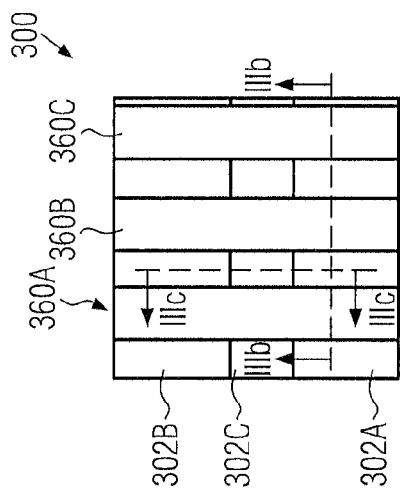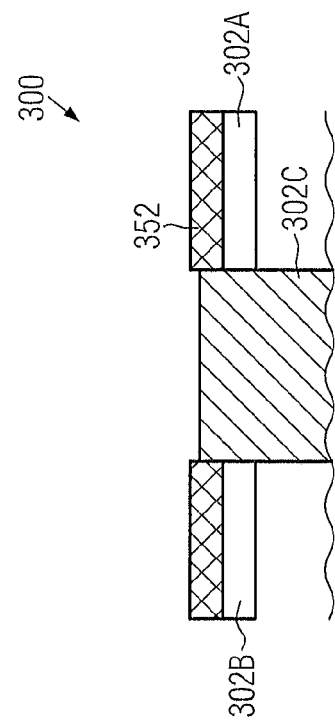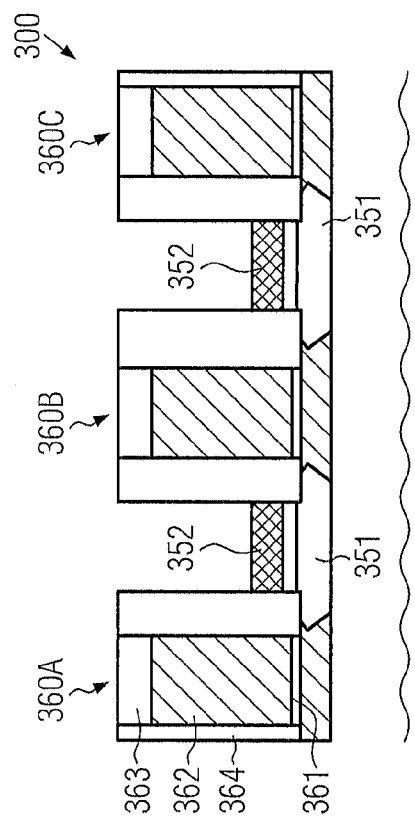

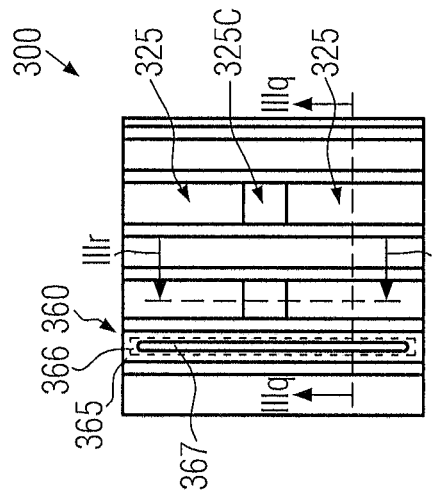
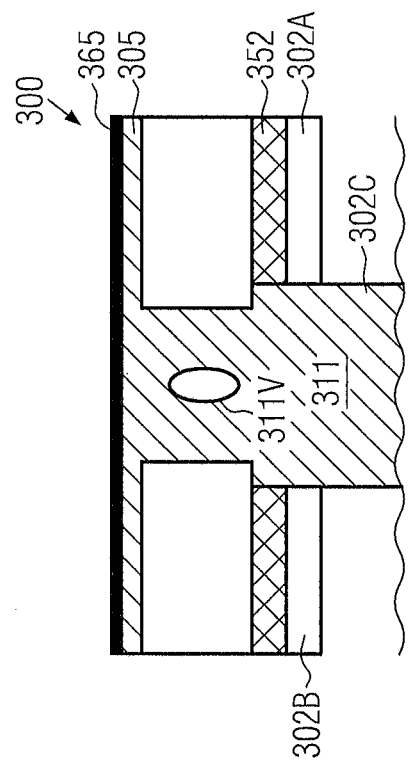
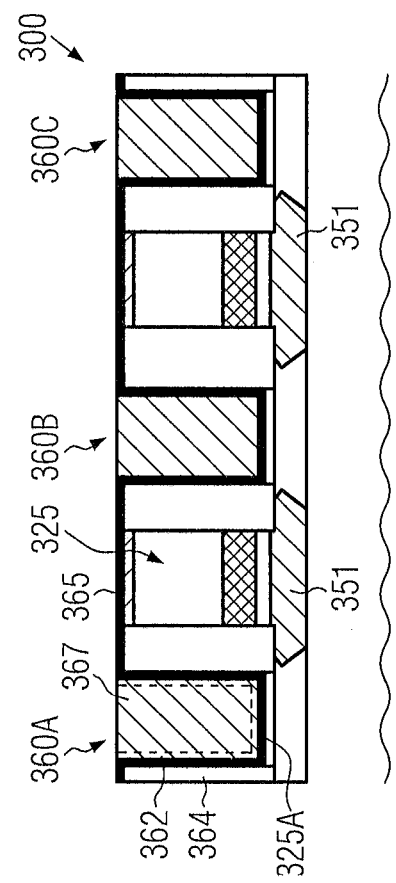

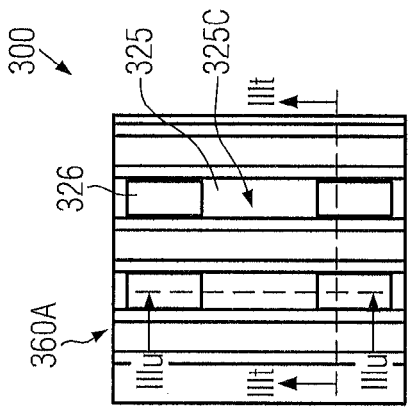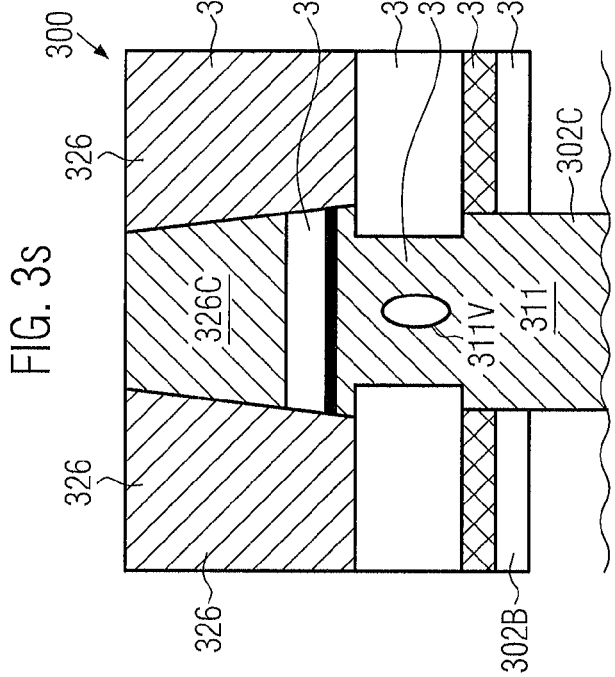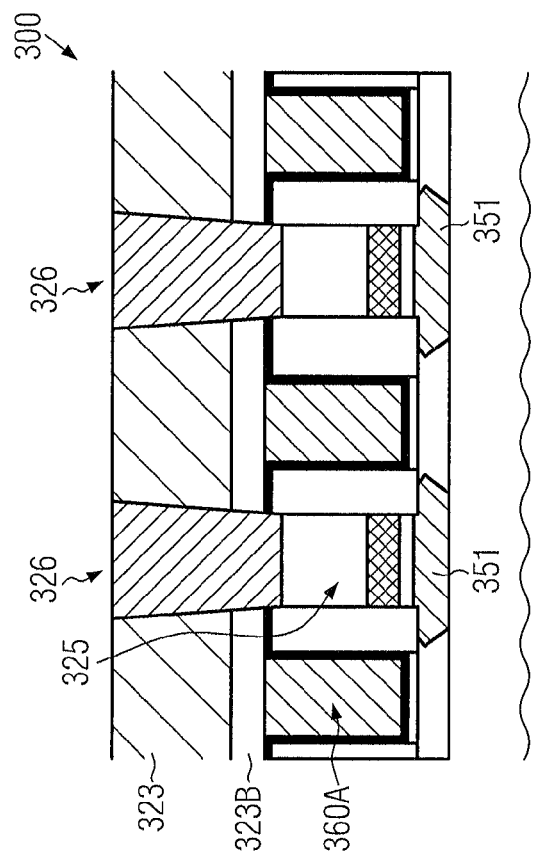

SEMICONDUCTOR DEVICE COMPRISING SELF-ALIGNED CONTACT ELEMENTS

BACKGROUND OF THE INVENTION

1. Field of the Invention

The present disclosure generally relates to the fabrication of integrated circuits, and, more particularly, to the contact level of a semiconductor device, in which contact areas, such as drain and source regions, as well as gate electrode structures, are connected to the metallization system of the semiconductor device.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

On the basis of the field effect transistors, more complex circuit components may be composed, such as inverters and the like, thereby forming complex logic circuitry, embedded memories and the like. Due to the reduced dimensions, the operating speed of the circuit components has been increased with every new device generation, wherein, however, the limiting factor of the finally achieved operating speed of complex integrated circuits is no longer the individual transistor element but the electrical performance of the complex wiring system, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections or vertical connections, which are also referred to as vias. These interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, which connects, with one end, to a respective contact region of a circuit element, such as a gate electrode and/or the drain and source regions of transistors, and, with another end, to a respective metal line in the metallization layer and/or to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level have to be provided with critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

With reference to FIG. 1, the critical situation upon forming contact elements in densely packed device areas will be described in more detail. FIG. 1 schematically illustrates a cross-sectional view of a semiconductor device 100 comprising a substrate 101, such as a silicon substrate and the like, in or above which is provided a silicon-based semiconductor layer 102. In the example shown, the substrate 101 and the layer 102 form a bulk configuration, i.e., the layer 102 initially represents a portion of a crystalline material of the substrate 101. In other cases, a buried insulating material may be formed below the semiconductor layer 102, thereby providing a silicon-on-insulator (SOI) architecture.

Furthermore, in the advanced manufacturing stage shown in FIG. 1, the semiconductor layer 102 is typically divided into a plurality of active regions or semiconductor regions by means of appropriate isolation structures, wherein, for convenience, a single active region 102A and a corresponding isolation region 102C are illustrated so that the active region 102A is laterally delineated by the isolation region 102C. Generally, an active region is to be understood as a semiconductor region in and above which one or more transistors are to be formed. In the present example, the active region 102A is to be understood as a densely packed device region since here a plurality of transistors 150 are formed in and above the active region 102A, thereby requiring a minimum lateral distance or pitch between the corresponding gate electrode structures 160A, 160B, 160C, 160D of the transistors 150. For example, a length of the gate electrode structures 160A, 160B, 160C, 160D may be 40 nm and less, wherein generally the length direction of the transistors 150 and of the active region 102A is represented by the horizontal direction in FIG. 1. Similarly, a width direction is to be understood as a direction extending perpendicularly to the drawing plane of FIG. 1.

In sophisticated semiconductor devices, generally performance of transistors may be enhanced by a plurality of techniques, in addition to continuously reducing the gate length and thus the channel length of the field effect transistors. For example, in some strategies, the charge carrier mobility in channel regions 153, i.e., in regions positioned below the gate electrode structures 160A, 160B, 160C, 160D and laterally confined by respective drain and source regions 151, may be increased by inducing certain stress conditions therein, thereby also enhancing drive current capability and thus switching speed. In this manner, in particular performance of transistors in logic circuit portions may be enhanced since here a high drive current capability in combination with high switching speed at moderately low threshold voltage values is typically required. To this end, a plurality of strain-inducing mechanisms have been developed, which may be implemented in the transistors 150, which, however, are not shown in FIG. 1. Moreover, generally, a reduction of length of the channel regions 153 is associated with an increase of the capacitive coupling between the gate electrode and the channel region, in particular in high performance transistors, and, for this reason, typically the gate dielectric material separating the channel region 153 from an electrode material of the gate electrode structures is reduced in thickness. In the past, silicon dioxide-based gate dielectric materials have been used due to the superior characteristics of a silicon/silicon dioxide interface with respect to high temperature treatments and the like, wherein, however, upon continuously shrinking the critical dimensions of the transistors, the moderately low dielectric constant of silicon dioxide-based dielectric materials may require a thickness of 2 nm and less of a corresponding gate insulation layer in order to comply with the performance requirements of transistors having a gate length well below 80 nm. In this case, however, the resulting leakage currents caused by hard carrier injection direct tunneling of charge carriers through the extremely thin silicon dioxide-based gate dielectric may no longer be compatible with thermal design power requirements. Therefore, new strategies have been developed in which at least a significant portion of the conventional gate dielectric material is replaced by a dielectric material of increased dielectric constant, wherein any such materials are typically referred to as high-k dielectric materials and have a dielectric constant of 10.0 and higher. For example, a plurality of metal oxides and silicates, such as hafnium oxide, zirconium oxide and the like, may be efficiently used as high-k dielectric materials. It turns out, however, that the incorporation of the high-k dielectric material also requires appropriately adapted strategies for adjusting the work function values of the gate electrode structures, which in turn requires the incorporation of specific work function metal species, such as titanium, tantalum, aluminum, lanthanum and the like, which may also be used as efficient electrode metals, thereby also increasing electrical conductivity and reducing degradation of any depletion zones in the vicinity of the gate dielectric material, as is also typically encountered in conventional silicon dioxide/polysilicon gate electrode structures. Since the high-k dielectric materials and the work function metal species may be highly sensitive with respect to high temperature treatments and the exposure to critical process atmospheres, as are typically encountered during the entire manufacturing process, in some very promising approaches, these materials are provided in a very late manufacturing stage on the basis of a so-called replacement gate approach.

Therefore, the gate electrode structures 160A, 160B, 160C, 160D are provided in the form of replacement gate structures comprising a gate dielectric material 165, which in turn includes a high-k dielectric material, and an electrode material 167, which may also include an appropriately selected work function metal species.

The semiconductor device 100 further comprises a contact level 120, which comprises a plurality of dielectric materials, such as a dielectric etch stop layer 121, typically provided in the form of a silicon nitride material, followed by a dielectric layer 122, such as a silicon dioxide-based material, or any other appropriate dielectric material which substantially fills the space between the densely packed gate electrode structures 160A, 160B, 160C, 160D. Furthermore, a further dielectric material 123 or material system may be provided in the form of silicon dioxide, possibly in combination with a silicon nitride material (not shown) and the like. Furthermore, as discussed above, contact elements 125 are formed so as to connect to the active region 102A, i.e., to appropriate contact regions within the drain and source areas 151, which are provided in the form of metal silicide regions 152, which may be comprised of any appropriate metal species, such as nickel, platinum and the like. The contact elements 125 typically comprise a contact metal, such as tungsten, indicated by 124A, typically in combination with appropriate barrier materials, such as titanium, titanium nitride and the like, which are for convenience not illustrated in FIG. 1. As shown, one of the contact elements 125, indicated by (a), is misaligned with respect to the gate electrode structure 160A and thus results in a short-circuit between the electrode material 167 and the conductive material 124A. In this case, a severe device failure may occur. Moreover, for the remaining contact elements, a degree of misalignment may be less pronounced so as to avoid a short-circuit between the associated gate electrode structures, wherein, however, nevertheless varying transistor characteristics may be obtained that depend on the alignment accuracy when forming the contact elements 125. For example, the size of the corresponding metal silicide region 152T for the contact element 125 (b) depends on the positioning of the contact element and thus the corresponding overall series resistance of the transistor as well as the parasitic capacitance significantly depends on the alignment accuracy and thus on the patterning strategy used for forming the contact elements 125.

The semiconductor device 100 as shown in FIG. 1 may be formed on the basis of the following process strategy. The active region 102A in combination with the isolation region 102C is formed by using well-established lithography, etch, deposition, anneal and material removal processes in combination with implantation sequences and associated masking regimes. Thereafter, according to replacement gate approaches, a substantially conventional gate layer stack, for instance based on silicon dioxide and polysilicon material, is provided in combination with additional hard mask materials, such as silicon nitride and the like, and the resulting layer stack is then patterned on the basis of sophisticated lithography and etch techniques, for instance on the basis of double exposure, double etch strategies for patterning the corresponding hard mask material in order to provide the resulting gate electrode structures with the desired lateral dimensions. Typically, the resulting gate electrode structures comprise a dielectric cap material, which may represent the residue of a hard mask material, for instance provided in the form of silicon nitride, silicon dioxide and the like. Thereafter, the further processing is continued by forming the drain and source regions 151 in combination with a spacer structure 164, which is typically accomplished by well-established deposition and etch techniques, while the drain and source regions 151 may be formed by selective epitaxial growth techniques, implantation processes, or any combination thereof. After any high temperature processes, the materials 121 and 122 are deposited by plasma enhanced chemical vapor deposition (CVD) and the like, followed by planarization and removal of any excess material, which is typically accomplished by applying at least one chemical mechanical polishing (CMP) process. During the corresponding planarization process, also a surface of a polysilicon material is exposed and the polysilicon material is then selectively removed on the basis of highly selective wet chemical etch recipes, plasma assisted etch recipes and the like. Next, a complex deposition and patterning regime is applied in order to incorporate the gate dielectric material 165 that includes the high-k dielectric material followed by the deposition of appropriately selected work function metal species and an electrode metal, which may be provided in the form of aluminum, aluminum alloys and the like. It should be appreciated that respective work function metal species may have to be provided differently for N-channel transistors and P-channel transistors, or differently for transistors requiring different threshold voltage values and the like. After removing any excess material and performing a heat treatment for thermally stabilizing and diffusing the work function metal species, the processing is continued, for instance, in some approaches, by taking advantage of the substantially planar surface conditions and forming a first portion of the contact elements 125 by applying highly sophisticated and critical lithography and etch techniques in order to etch into the materials 122 and 121 laterally adjacent to the gate electrode structures 160A, 160B, 160C, 160D so as to connect to the drain and source regions 151. To this end, a plurality of appropriately shaped contact openings are typically formed, thereby requiring extremely sophisticated lithography techniques, which have to ensure a high alignment accuracy, which, however, due to the reduced pitch, may nevertheless result in a certain degree of misalignment as, for instance, shown for the contact elements 125. Thereafter, a dielectric material 123 is formed and appropriately patterned so as to form contact openings connecting to the previously formed contact elements and also connecting to the gate electrode structures 160A, 160B, 160C, 160D as required by the overall circuit layout, wherein any such contacts are typically provided outside of the active region 102A in order to avoid gate contact failures, i.e., short circuits with the drain and source regions with a certain degree of misalignment. In other strategies, the contact elements 125 may be formed in a single patterning process, i.e., after providing the material 123, thereby also requiring extremely sophisticated lithography techniques and etch recipes, since in this case the patterning process has to be performed for contact openings of very different depth, i.e., for contact openings connecting to the gate electrode structures and contact openings connecting to the drain and source regions 151.

In the former approach for forming the contact elements 125 prior to actually depositing the contact material 124A, for instance in the form of tungsten, typically the metal silicide regions 152 are provided on the basis of well-established silicidation regimes in order to further reduce the overall contact resistivity, wherein the resulting transistor characteristics may thus significantly depend on the alignment accuracy, as is also discussed above.

Hence, in order to provide superior uniformity of the resulting transistor characteristics and reduced yield loss caused by short circuits between the contact elements and the gate electrode structures, a "self-aligned" patterning regime would be desirable in which the contact openings and thus the contact elements, at least within the dielectric material 122, could be provided, for instance, on the basis of etch strategies which are highly selective with respect to the gate electrode structures. In this case, the gate electrode structures have to be reliably encapsulated by any appropriate etch stop material which, however, is not compatible with sophisticated replacement gate approaches, as described above, since here the top surface of the electrode material is exposed and would require a dedicated etch stop material, which in turn would have to be provided on the basis of an extremely complex lithography and patterning process, thereby resulting in even more process non-uniformities.

In view of the situation described above, the present disclosure relates to process techniques and semiconductor devices in which sophisticated high-k metal gate electrode structures may be provided on the basis of a replacement gate approach, as may be required for high performance transistors, while, on the other hand, contact elements may be provided, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which replacement gate approaches may be applied so as to form high-k metal gate electrode structures, for instance as required for sophisticated transistor elements in logic circuit portions and the like, while at the same time contact elements connecting to the active region of the transistors may be provided in a self-aligned manner. That is, the contact elements may be provided so as to be self-aligned with respect to the gate electrode structures in a length direction, thereby avoiding extremely critical lithography processes that may be required in conventional strategies in order to appropriately position the contact elements in the length direction of the transistors. In order to achieve high compatibility with the replacement gate approach, the contact elements may be formed prior to replacing the placeholder material of the gate electrode structures so that the gate electrode structures are still appropriately encapsulated when forming the contact elements. To this end, in some illustrative embodiments disclosed herein, a less critical lithography process may be applied in the presence of a portion of the interlayer dielectric material by using an appropriate etch mask, which may substantially define the shape and size of the resulting contact elements in the transistor width direction, wherein, in some illustrative embodiments, the size of the corresponding mask opening may be comparable to the size of the active region, while nevertheless ensuring a sufficient process margin with respect to tip portions of the gate electrode structures in order to avoid short circuits between the drain region and the source region. Furthermore, by appropriately defining "exclusion zones" within the active region, i.e., zones in which the self-aligned contact elements connecting to the active region are not provided, even a contacting of gate electrode structures partially or completely within the lateral dimensions of the active region may be realized, thereby significantly reducing the required lateral area for a given circuit configuration. That is, at least some of the gate-to-gate connections may be routed partially above the active region, contrary to conventional design strategies in which generally the gate electrode structures are contacted over isolation regions.

In other illustrative embodiments, the contact material may be provided in an early manufacturing stage, i.e., prior to actually forming the interlayer dielectric material, thereby also providing the contact material in a "self-aligned" manner, with a subsequent patterning thereof, and may be accomplished on the basis of substantially planar surface topography, wherein less critical lithography conditions are obtained since the actual patterning may be required along the transistor width direction only. Therefore, during this patterning process, the corresponding "opening" formed so as to separate the contact elements with respect to the transistor width direction may be controlled by additional deposition processes, if required, thereby even further enhancing the "resolution" of the resulting patterning process. Subsequently, the opening may be filled with an appropriate dielectric material, wherein the formation of any voids is not critical, thereby providing superior flexibility in selecting appropriate interlayer dielectric materials and deposition techniques.

One illustrative method disclosed herein comprises forming a contact element laterally adjacent to a gate electrode structure so as to connect to one of a drain region and a source region that are formed in an active region of a semiconductor device, wherein the gate electrode structure comprises a placeholder electrode material that is covered by a dielectric cap layer. The method further comprises replacing the placeholder electrode material at least with an electrode metal in the presence of the contact element.

A further illustrative method disclosed herein comprises forming a dielectric layer laterally adjacent to a plurality of gate electrode structures that are formed above an active region of a semiconductor device. The method further comprises forming a contact opening in the dielectric material so as to connect to the active region and forming a contact element in the contact opening. Moreover, a placeholder material of the plurality of gate electrode structures is replaced at least with a metal-containing electrode material after forming the contact element.

One illustrative semiconductor device disclosed herein comprises a plurality of gate electrode structures formed on an active region, wherein each of the plurality of gate electrode structures comprises a high-k dielectric material, an electrode metal and a dielectric sidewall spacer structure. The semiconductor device further comprises a contact element formed laterally between two of the plurality of gate electrode structures in a first dielectric material and connects to the active region, wherein the contact element is delineated in a length direction by the dielectric spacer structures. Furthermore, the semiconductor device comprises an interconnect structure formed in a second dielectric material above the first dielectric material, wherein the interconnect structure comprises a first interconnect portion connecting to the contact element and comprises a second interconnect portion that connects to at least one of the plurality of gate electrode structures.

BRIEF DESCRIPTION OF THE DRAWINGS

The disclosure may be understood by reference to the following description taken in conjunction with the accompanying drawings, in which like reference numerals identify like elements, and in which:

FIGS. 2a-2f schematically illustrate cross-sectional views of a semiconductor device during various manufacturing stages in which contact openings may be formed in a self-aligned manner, according to illustrative embodiments, prior to performing a replacement gate approach;

FIGS. 2h-2l schematically illustrate cross-sectional views of the semiconductor device in further advanced manufacturing stages in which the placeholder material of the gate electrode structures may be exposed in the presence of the contact elements, according to illustrative embodiments;

FIGS. 2o-2t schematically illustrate cross-sectional views of the semiconductor device in further advanced manufacturing stages in which contact elements, i.e., metal "zero" interconnect structures, may be provided so as to connect to gate electrode structures and to the previously formed self-aligned contact elements, according to illustrative embodiments;

FIGS. 2u-2v schematically illustrate a top view of typical contact layouts obtained on the basis of the self-aligned contact elements, according to illustrative embodiments;

Figure 1:
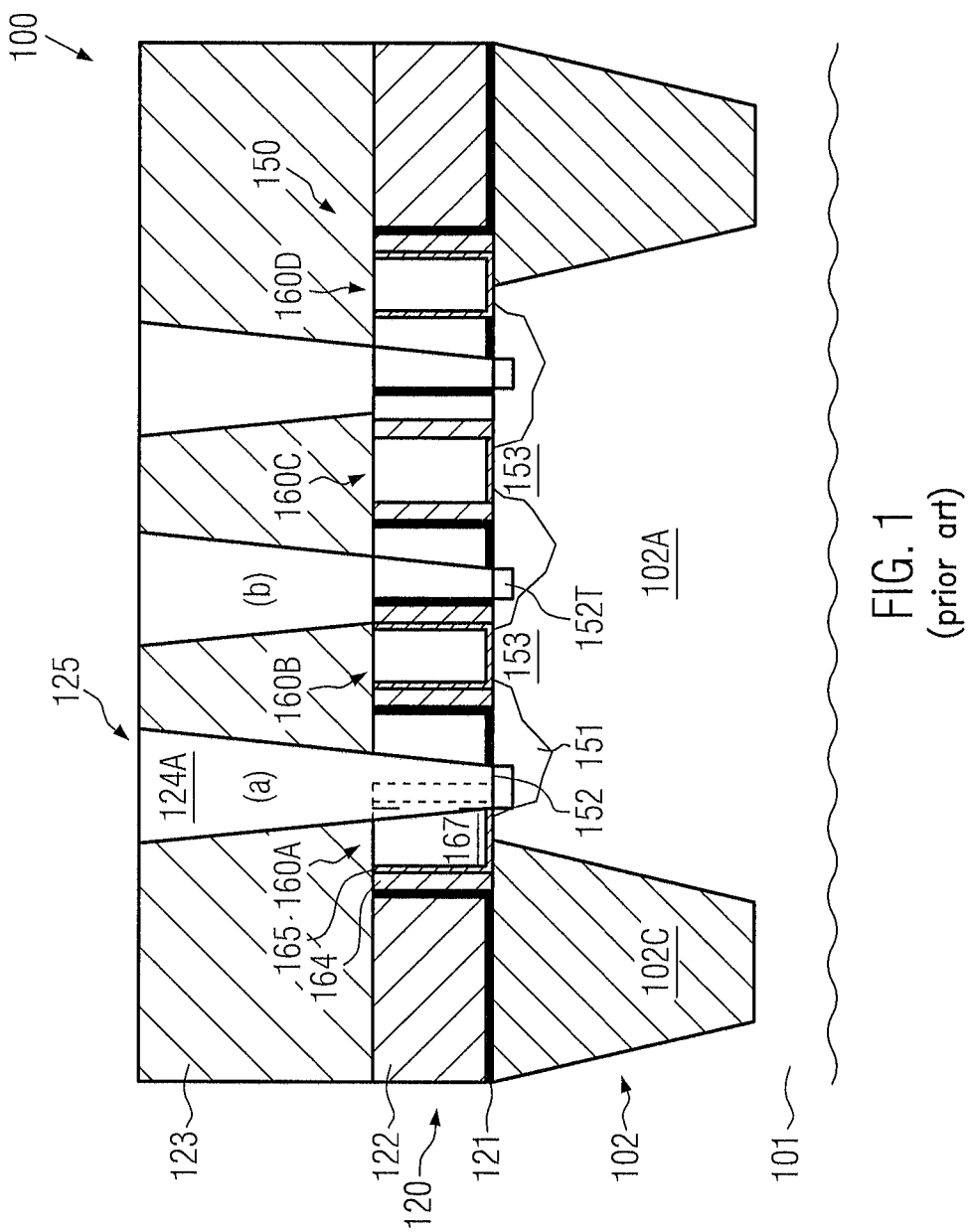
FIG. 1 schematically illustrates a cross-sectional view of a sophisticated semiconductor device including densely packed transistors comprising high-k metal gate electrode structures formed on the basis of a replacement gate approach in combination with contact elements, which may be misaligned due to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which self-aligned contact elements, or at least the conductive contact material, may be provided in the manufacturing stage in which the gate electrode structures still comprise the placeholder material. In this case, the contact material may be patterned or, in other embodiments, the contact elements may be appropriately patterned, wherein the gate electrode structures may still be encapsulated so as to provide superior etch resistivity or the placeholder material itself may enable the processing of the contact material without unduly affecting the gate electrode structures. Consequently, the placeholder material may be exposed during or after the processing of the contact elements and the actual replacement of the placeholder material with at least a metal-containing electrode material and, typically, also with a high-k dielectric material, may be accomplished in the presence of the contact elements substantially without affecting the process sequence for incorporating the sophisticated material or material system into the gate electrode structures.

In some illustrative embodiments disclosed herein, the size, shape and position of the self-aligned contact elements may be restricted by an appropriately selected etch mask, which may have dimensions comparable to the lateral dimensions of the active regions under consideration, thereby significantly relaxing the constraints for the corresponding lithography processes. That is, the contact elements may be restricted in the transistor width direction by appropriately selecting the dimensions of the corresponding etch mask, which, however, may have significantly greater dimensions compared to conventional highly sophisticated patterning regimes for forming, for example, square-like or roundish contact openings. Similarly, the dimensions of the mask opening of the etch mask in the length direction may be comparable to the dimensions of the active region, wherein, in this direction, the self-aligned nature may be achieved by the etch selectivity of the gate electrode structures, which may still be reliably confined or which may have a sufficient etch selectivity with respect to the interlayer dielectric material. On the other hand, by appropriately selecting the shape and size of the mask opening, also specific "exclusion" zones may be provided above the active region, i.e., in these exclusion zones, the dielectric material between the gate electrode structures is locally preserved so that gate electrode structures may be reliably contacted within these exclusion zones without increasing the probability of creating short circuits between the gate contacts and the drain and source regions. That is, by defining appropriate exclusion zones for the self-aligned contact elements, appropriate "field areas" may be provided within the active region, while nevertheless, outside of the exclusion zone, a sufficient contact area for the self-aligned drain and source contact may be provided so as to not unduly affect the overall transistor behavior, for instance with respect to series resistance and the like. Due to the possibility of contacting the gate at least partially over the active region, a significantly more compact layout may be achieved, thereby enabling an overall size reduction of complex semiconductor devices for given critical dimensions of the basic transistor elements.

In other illustrative embodiments, the contact material may be provided in a "self-aligned" manner by performing a blanket deposition prior to forming an interlayer dielectric material between the gate electrode structures and the corresponding contact metal may be patterned so as to provide respective "isolation openings" which may be subsequently filled with the dielectric material, wherein the formation of any voids, for instance caused by deposition-related irregularities, may be non-critical since any such voids would be isolated voids, which may not be filled with any conductive material in the further processing of the semiconductor device. In this case, also the lithography process for appropriately defining the isolation openings may be less critical compared to conventional strategies since, for instance, an isolation of the various contact material islands may be necessary with dimensions that may correspond to the lateral dimensions of active regions, wherein a further reduction in size of any such isolation regions may be accomplished by deposition processes, thereby even further reducing the requirements for the corresponding lithography process. Consequently, after the non-critical filling of the resulting isolation openings, the further processing may be continued on the basis of appropriate replacement gate approaches without being affected by forming contact elements.

With reference to FIGS. 2a-2z and 3a-3u, further illustrative embodiments will now be described in more detail, wherein reference may also be made to FIG. 1, if appropriate.

It is to be noted that any components and devices, as well as process techniques used for forming semiconductor devices, may be denoted by reference signs in which the first digit indicates the number of the figure, while the remaining digits and letters indicate a specific component or process. Like or similar components or processes having the same reference number except for the leading digit that indicates the number of the figure associated therewith may not be described in detail in each embodiment, and any such components should be considered as being interchangeable in the various figures described with reference to FIGS. 2a-2z and 3a-3u. The same holds true for any components described with reference to FIG. 1, as long as any such components or processes are compatible with the embodiments of the present disclosure.

Figure 2A:
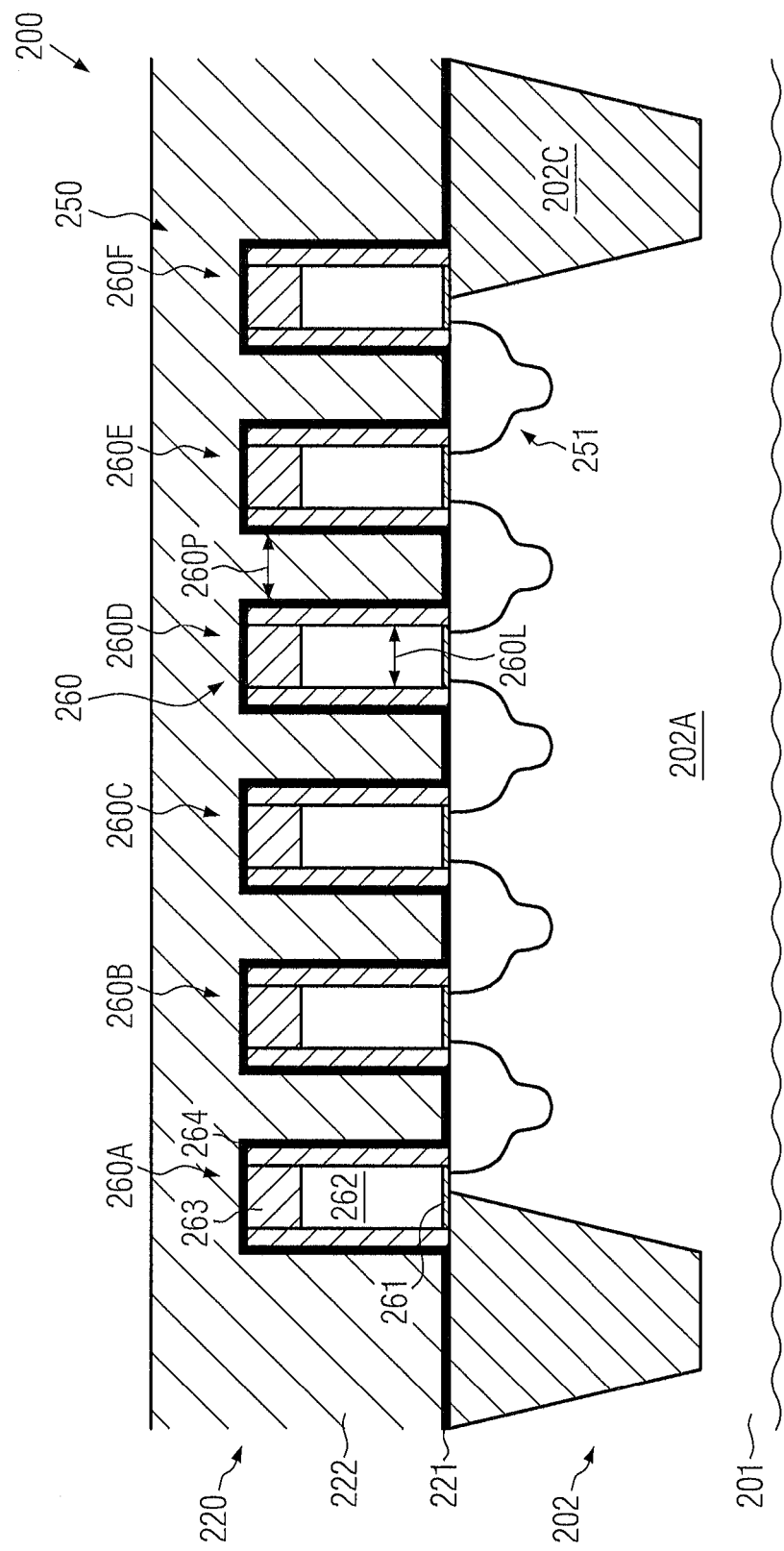

FIG. 2a schematically illustrates a cross-sectional view of a semiconductor device 200 comprising a substrate 201 and a semiconductor layer 202. As discussed with reference to the device 100, the substrate 201 and the semiconductor layer 202 may form a bulk configuration or an SOI configuration, depending on the overall device requirements. Moreover, an active region 202A may be provided in the semiconductor layer 202 and may be laterally delineated by an isolation region 202C, provided in the form of a shallow trench isolation and the like. Furthermore, a plurality of transistors 250 may be formed in and above the active region 202A. In the manufacturing stage shown, the basic configuration of the transistors 250 may be established with respect to drain and source regions 251, which may have any appropriate lateral and vertical dopant profile as required for the transistors 250. Moreover, the transistors 250 may comprise respective gate electrode structures 260, which, however, are still to be "converted" into high performance gate electrode structures by replacing at least a placeholder material 262, such as a polysilicon material and the like, with at least a metal-containing electrode material, possibly in combination with a high-k dielectric material and an appropriate work function metal species, as is also discussed above. In the manufacturing stage as shown in FIG. 2a, the gate electrode structures 260 may thus further comprise an etch stop material or dielectric material 261, such as a silicon dioxide material and the like, and a dielectric cap layer or cap layer system 263 in combination with a spacer structure 264. As discussed above, in sophisticated applications, a gate length, indicated as 260L, representing an extension of the placeholder material 262, may be approximately 30 nm and less, while the spacer structure 264 may have a width of approximately 5-15 nm. Moreover, a pitch 260P, i.e., the width of the opening formed between adjacent two of the gate electrode structures 260 may be on the order of magnitude of 20-30 nm. It is to be noted that the half-pitch is usually defined between the gates without spacers. Thus, 260P denotes the separation after spacer formation. So the actual pitch in the usual sense, i.e., independent from the width of the gates, e.g., from the left edge of one gate to another left edge of the next gate, is in the range of 80-90 nm, or even below for <20 nm technology. It should be appreciated, however, that these dimensions may vary depending on the specific area within the device 200 and generally in accordance with the overall design rules. Moreover, in this manufacturing stage, a portion of a contact level 220 in the form of a first dielectric layer 221, such as a silicon nitride etch stop layer having a thickness of approximately 10 nm and less, may be provided in combination with a further dielectric material 222, such as a silicon dioxide-based material and the like. As shown, the dielectric material 222 may be provided so as to extend above the gate electrode structures 260A-260F with a height of approximately 50-200 nm.

Basically, the semiconductor device 200 as shown in FIG. 2a may be formed on the basis of similar process techniques as are also previously discussed with reference to the device 100. That is, after forming the isolation structures 202C, thereby laterally delineating the active region 202A, the gate electrode structures 260A-260F may be formed by patterning strategies as discussed above. Moreover, the drain and source regions 251 may be formed on the basis of selective epitaxial growth techniques, implantation processes and the like, wherein strain-inducing materials may also be incorporated, as will be described later on. After any high temperature processes, if required, the materials 221, 222 may be formed, for instance, by plasma enhanced deposition techniques, thermally activated deposition techniques for the etch stop material 221, while the material 222 may be formed by spin-on techniques, CVD and the like. If required, an additional planarization step may be implemented in order to provide superior surface topography.

Figure 2B:
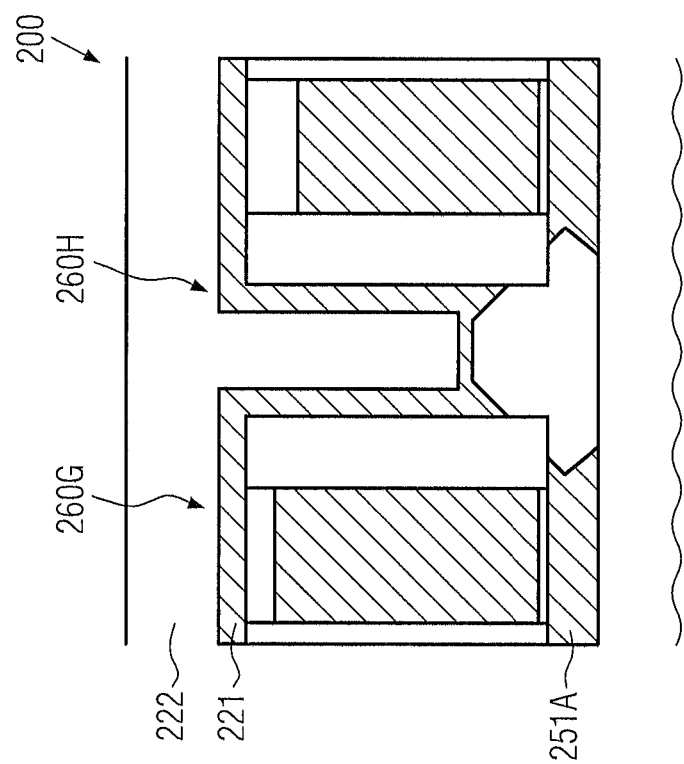

FIG. 2b schematically illustrates a cross-sectional view of a portion of the device 200 wherein two gate electrode structures 260G, 260H are illustrated, which may be one of the gate electrode structures 260 as shown in FIG. 2a, or which may represent gate electrode structures provided in a different area of the device 200. As shown, a semiconductor alloy 251A may be provided as part of the drain and source regions or may actually represent the drain and source region, wherein the alloy 251A may provide a desired strain component so as to increase charge carrier mobility in a channel region, as is also previously discussed. Furthermore, an appropriate dopant concentration may be provided by the material 251A. To this end, well-established process strategies may be applied in order to form a cavity in the active region and refill and possibly over-fill, as shown in FIG. 2b, the resulting cavities with the semiconductor alloy 251A on the basis of selective epitaxial growth techniques. Furthermore, in some illustrative embodiments, as shown in FIG. 2b, the layer 222 formed above the gate electrode structures 260G, 260H may be preserved during the further processing, while in other cases any excess material may be removed.

Figure 2C:
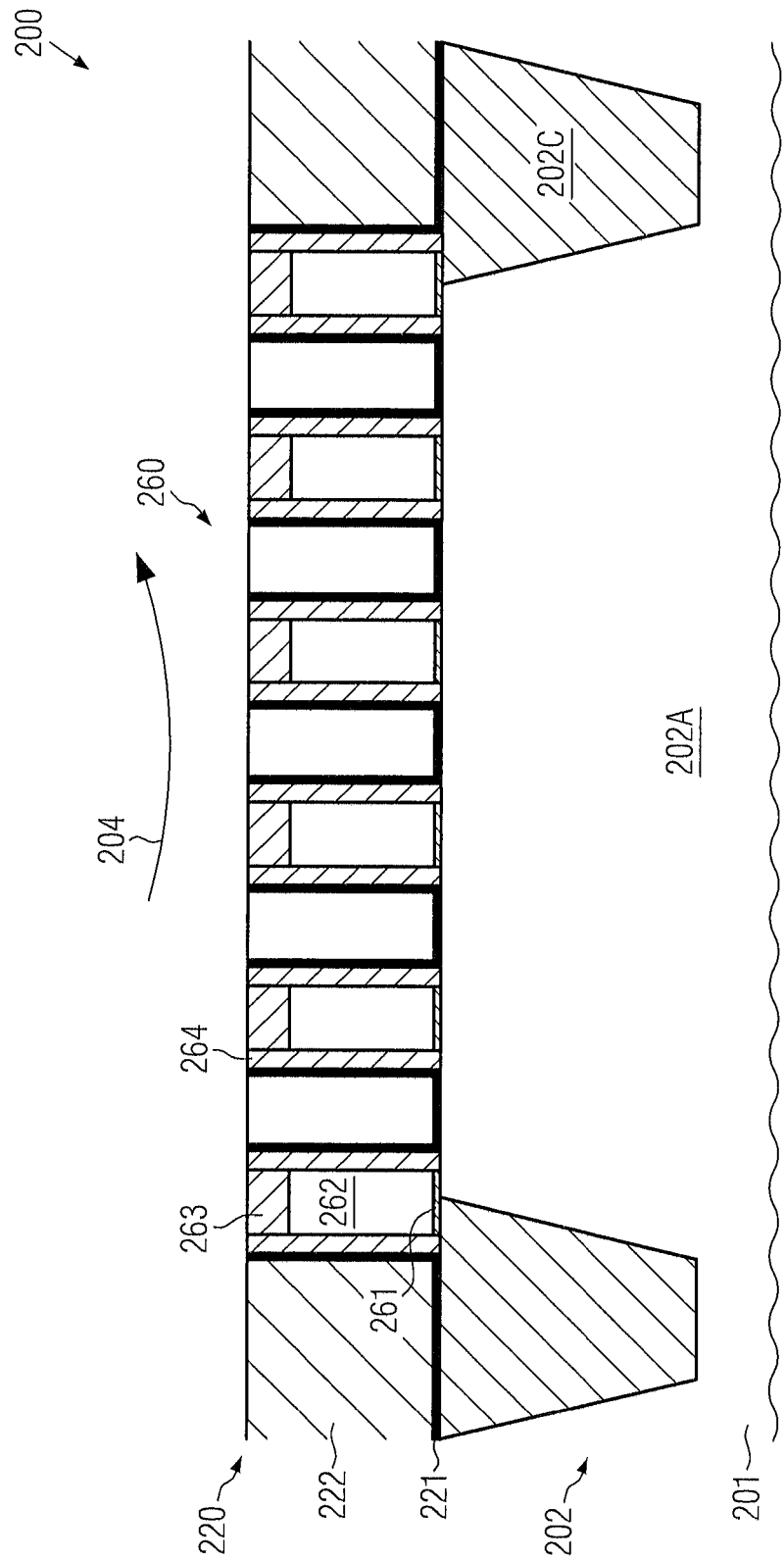

FIG. 2c schematically illustrates the device 200 according to illustrative embodiments in which the material 222 may be removed from above the gate electrode structures 260. To this end, well-established CMP recipes may be applied, for instance for removing silicon dioxide material, wherein dielectric cap layers 263, for instance formed of silicon nitride, may be used as efficient stop materials.

Figure 2D:
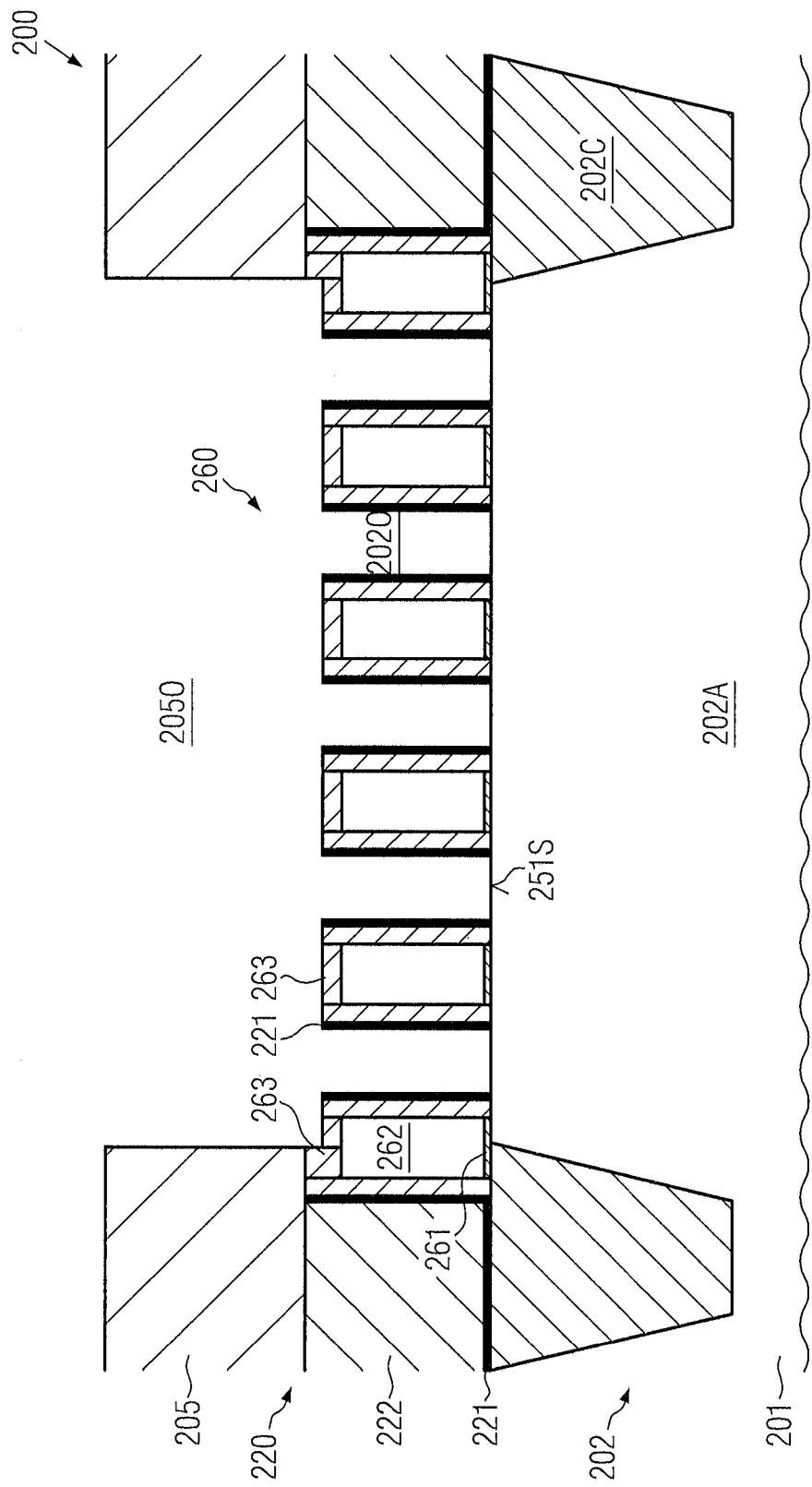

FIG. 2d schematically illustrates the device 200 in a further advanced manufacturing stage in which an etch mask 205, such as a hard mask, may be formed so as to expose a desired area of the device 200 in which self-aligned contact elements are to be formed between the corresponding gate electrode structures 260. To this end, the mask 205 comprises an appropriate mask opening 205O that laterally delineates the area in which a conductive contact material is to be filled into the spacing or contact opening 202O between the gate electrode structures 260. The etch mask 205 may be formed on the basis of appropriate lithography techniques wherein the size of the opening 205O may provide superior process conditions, since generally the opening 205O may, in some illustrative embodiments, be selected with a size that is comparable to the lateral dimensions of the active region 202A and thus may have significantly greater dimensions compared to conventional contact elements formed on the basis of a square-like or roundish cross-sectional shape. The etch mask 205 may be comprised of any appropriate material, such as resist material, hard mask materials in the form of amorphous carbon, silicon nitride and the like. Based on the etch mask 205, the exposed portion of the dielectric material 222 may be removed on the basis of any appropriate anisotropic etch recipe, wherein the layer 221 may be used as an etch stop material, in combination with the cap layer 263 formed in the gate electrode structures 260. Thereafter, an etch step may be applied so as to expose the surface 251S of the active region 202A between the gate electrode structures 260, while a portion of the cap layers 263 may still be preserved.

FIG. 2e schematically illustrates a cross-sectional view of the device 200 in which the material 222 may still be preserved above the gate electrode structures 260G, 260H, as is also discussed above with reference to FIG. 2b, or the material 222 may be re-deposited after the polish down to gate. Hence, in this case, a mask 205 may be formed above the material 222 and may be comprised of any appropriate layers, such as an anti-reflective coating (ARC) material including silicon 205A in combination with an appropriate hard mask material, such as amorphous carbon and the like. The corresponding patterning process thus may etch through the layer 222 and may also remove the material between the gate electrode structures 260G, 260H. Thereafter, the silicon nitride material may be removed, thereby finally exposing the surface 251S.

FIG. 2f schematically illustrates a top view of a portion of the device 200 thereby indicating various options for the etch mask 205 in order to define appropriately sized and positioned mask openings and thus the resulting exposed surface areas 251S.

Figure 2G:
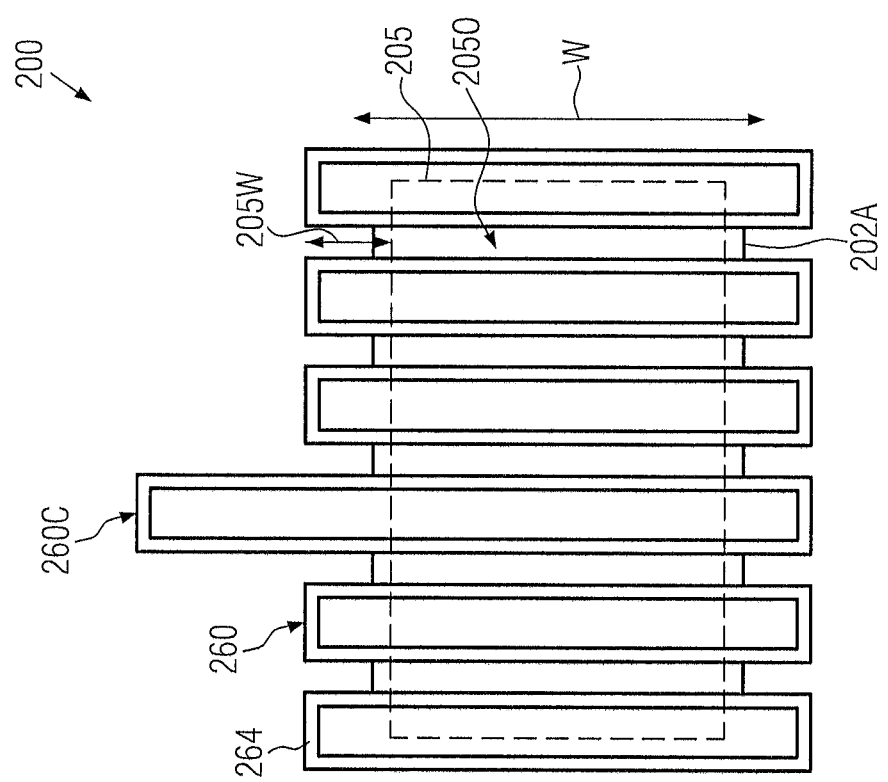
FIG. 2g schematically illustrates a top view of the semiconductor device comprising a mask opening that defines the position, shape and size of the contact openings within an active region, according to illustrative embodiments.

FIG. 2g schematically illustrates a top view of the device 200 according to embodiments in which the mask opening 205O substantially corresponds to the lateral size of the active region 202A, as for instance described with reference to FIG. 2d. Moreover, as shown, the gate electrode structures 260 may extend beyond the active region 202A in a width direction, indicated as W, wherein any gate electrode structures which may need to be contacted may have a corresponding increased end tip so as to provide sufficient process margins with respect to any alignment inaccuracies. For example, the gate electrode structure 260C may have to be contacted and may thus have an increased "width" compared to the remaining gate electrode structures 260, which may not require a contacting within the contact level still to be formed. Moreover, as shown, in some illustrative embodiments, the lateral dimension of the mask opening 205O in the width direction is selected so as to ensure a sufficient distance 205W with respect to the tip portions of the gate electrode structures 260 so as to avoid a "merging" of any contact material that is to be formed between the spaces of the gate electrode structures 260 in the further processing. Consequently, the opening 205O substantially defines the area in which a conductive contact material is to be filled into the spaces between the gate electrode structures and is, in the embodiment shown, restricted in the transistor width direction W so as to be "within" the active region 202A. It should be appreciated that the term "within" is to be understood as a projection of the lateral dimension of the opening 205O on the active region 202A, since the mask 205 is actually provided above the active region 202A and any resulting contact elements are formed so as to connect to the active region 202A without actually "penetrating" the active region.

Figure 2H:
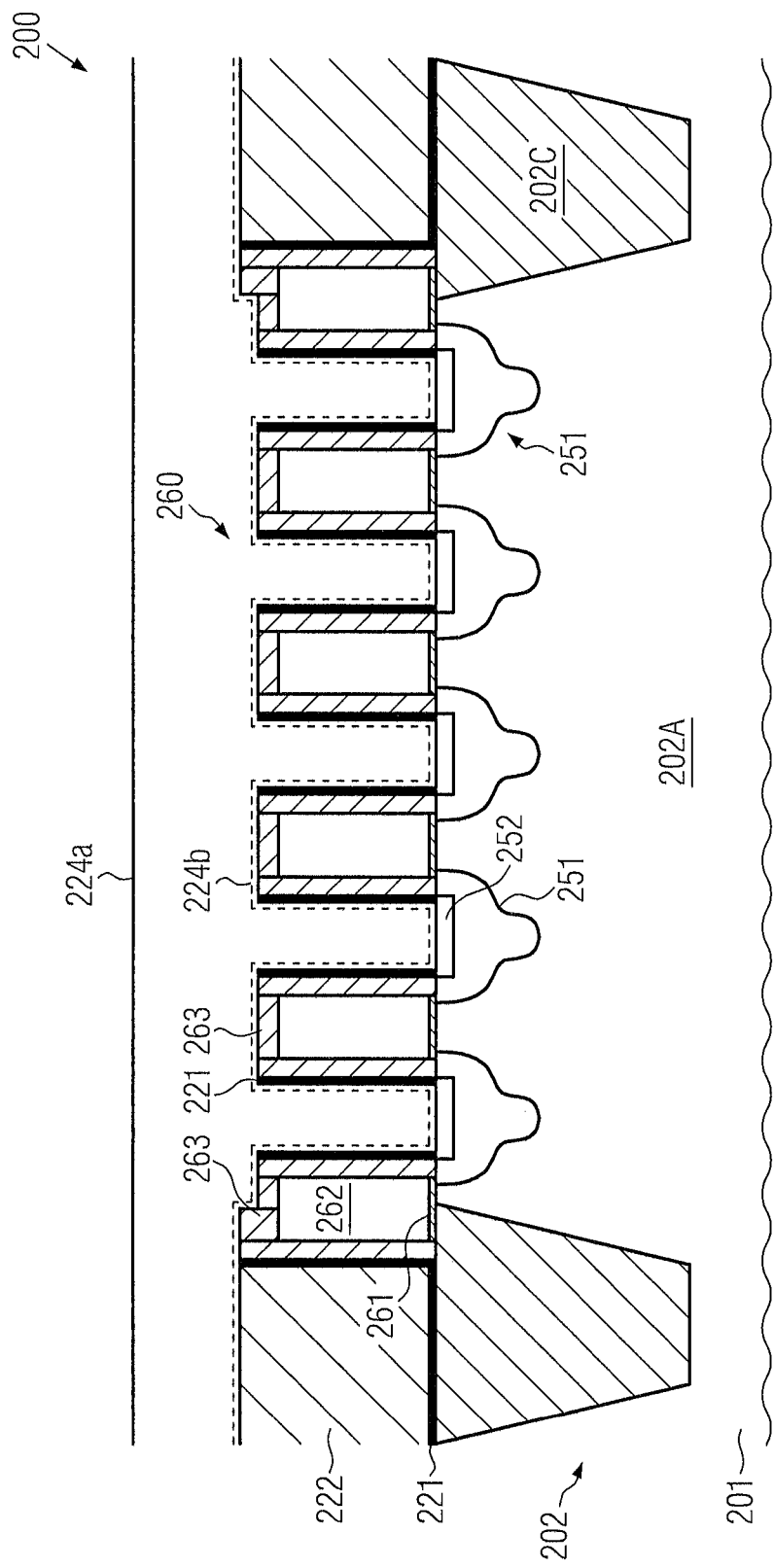

FIG. 2h schematically illustrates the device 200 in a further advanced manufacturing stage. As shown, a contact material 224A, possibly in combination with one or more appropriate barrier materials 224B, may be formed between and above the gate electrode structures 260. Moreover, if required, contact regions 252, for instance in the form of metal silicide, may be provided in the drain and source regions 251, thereby reducing a contact resistance between the drain and source regions 251 and contact elements to be formed from the materials 224A, 224B, if provided.

The device 200 as shown in FIG. 2h may be formed on the basis of the following processes. After the removal of the etch mask 205 (FIGS. 2d-2g), in combination with any cleaning process, the metal silicide regions 252 may be formed, for instance, by depositing an appropriate refractory metal and initiating a silicidation process. In other illustrative embodiments, the formation of the metal silicide 252 may be combined with the deposition of the material 224A, which may involve the application of a heat treatment, for instance when forming a tungsten material on the basis of CVD techniques. In this case, the previously applied refractory metal may be used as an efficient barrier material and may also undergo a silicidation process to form the regions 252. In other illustrative embodiments, the material 224A, possibly in combination with a barrier material, may be formed on the basis of any other deposition techniques, such as electrochemical deposition techniques and the like.

Moreover, during the silicidation process, the remaining dielectric etch stop layer may provide an increased lateral offset of the regions 252, which may thus reduce the probability of shorting the drain and source regions 251 when using refractory metal materials which may tend to form metal silicide protrusions upon performing the silicidation process. For example, nickel silicide is known to be formed in a non-uniform manner so that the additional offset provided by the layer 221 may nevertheless result in predictable contact characteristics. In other cases, the metal silicide regions 252 may be formed in an earlier manufacturing stage, i.e., prior to the deposition of the layer 221, if considered appropriate.

Figure 2I:
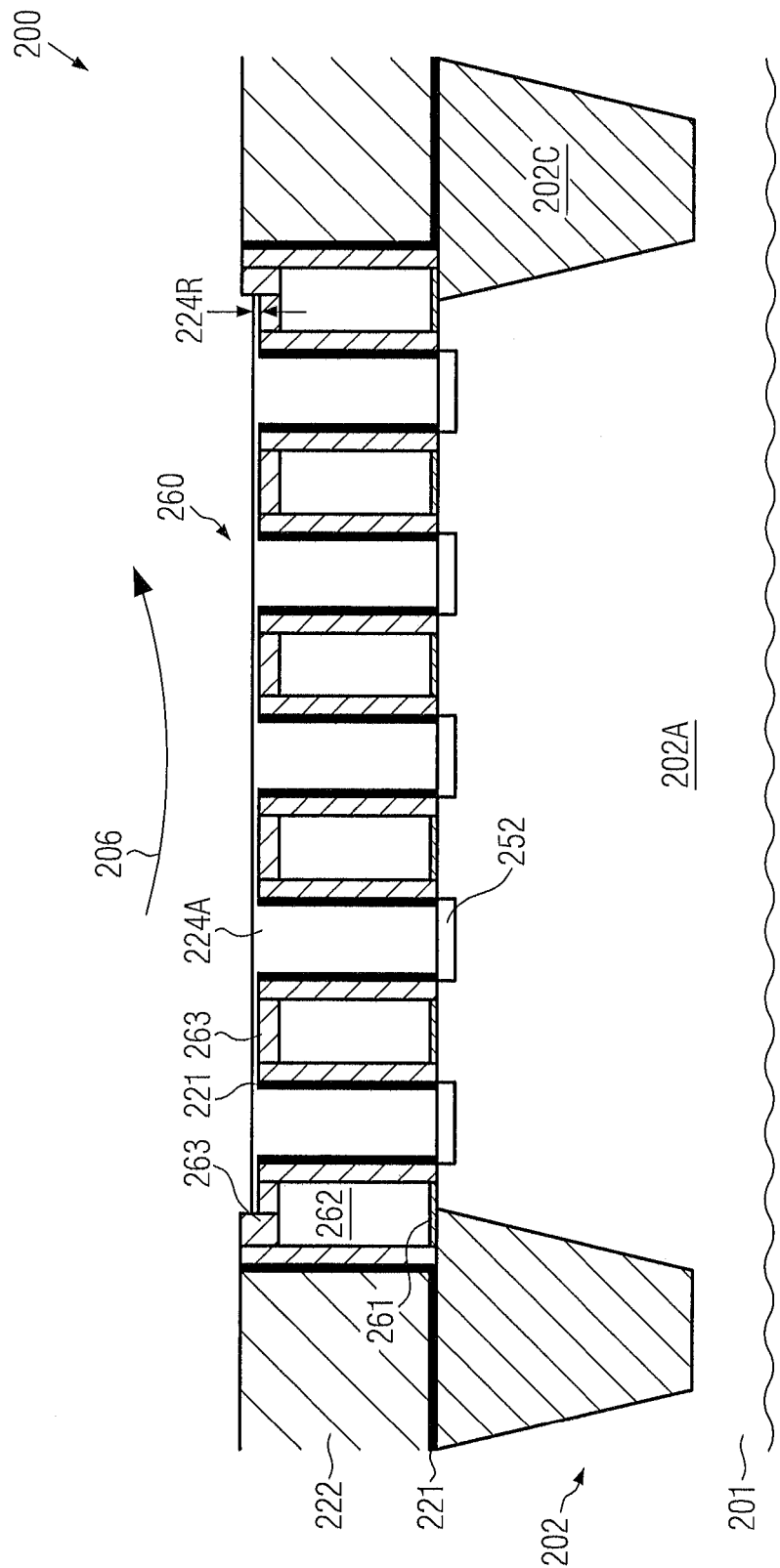

FIG. 2i schematically illustrates the device 200 in illustrative embodiments in which a portion of the excess metal may be removed by a polishing process 206, wherein a certain degree of over-polishing may result in a recessing 224R of the material 224A.

Figure 2J:
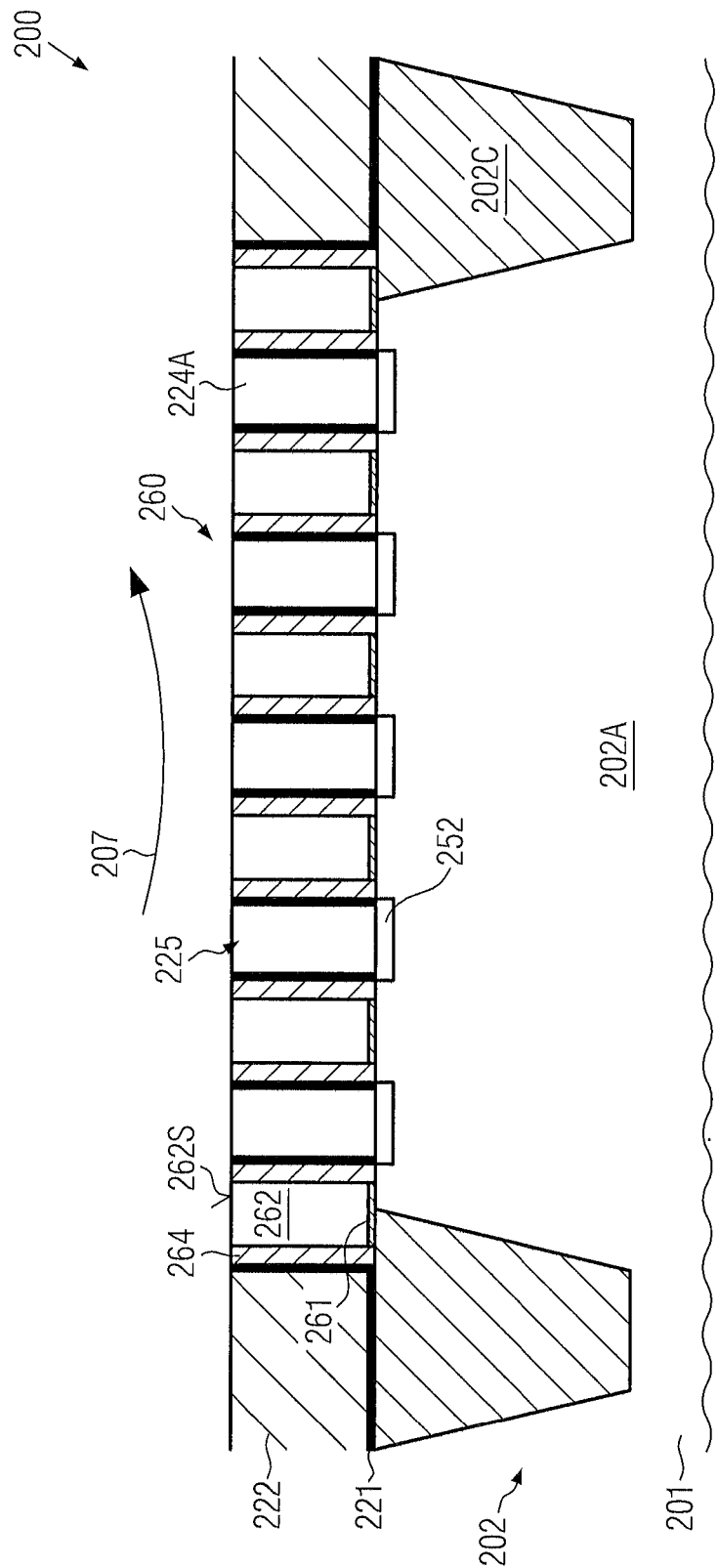

FIG. 2j schematically illustrates the device 200 in a further advanced manufacturing stage according to illustrative embodiments in which a further removal process 207, in the form of a polishing process, may be applied which may have a substantially non-selective removal behavior with respect to the dielectric materials and the contact material 224A. For example, tungsten, oxide and nitride may be removed during the process 207, thereby obtaining a substantially planar surface topography and also forming contact elements 225, which are electrically isolated from each other and are confined in the length direction by two neighboring gate electrode structures 260, i.e., by the corresponding sidewall spacer structures 264, which in this manufacturing stage comprise residues of the etch stop layer 221. On the other hand, in the transistor width direction, i.e., the direction perpendicular to the drawing plane of FIG. 2j, the contact elements 225 may be confined by the materials 222 and 221 that have been patterned in accordance with the corresponding etch mask 205 (FIGS. 2d-2g). Moreover, in this embodiment, during the removal process 207, the surface 262S of the placeholder material 262 may be exposed. Consequently, in this manufacturing stage, the gate electrode structures 260 may be prepared for performing a replacement gate sequence in the presence of the self-aligned contact elements 225.

Figure 2K:
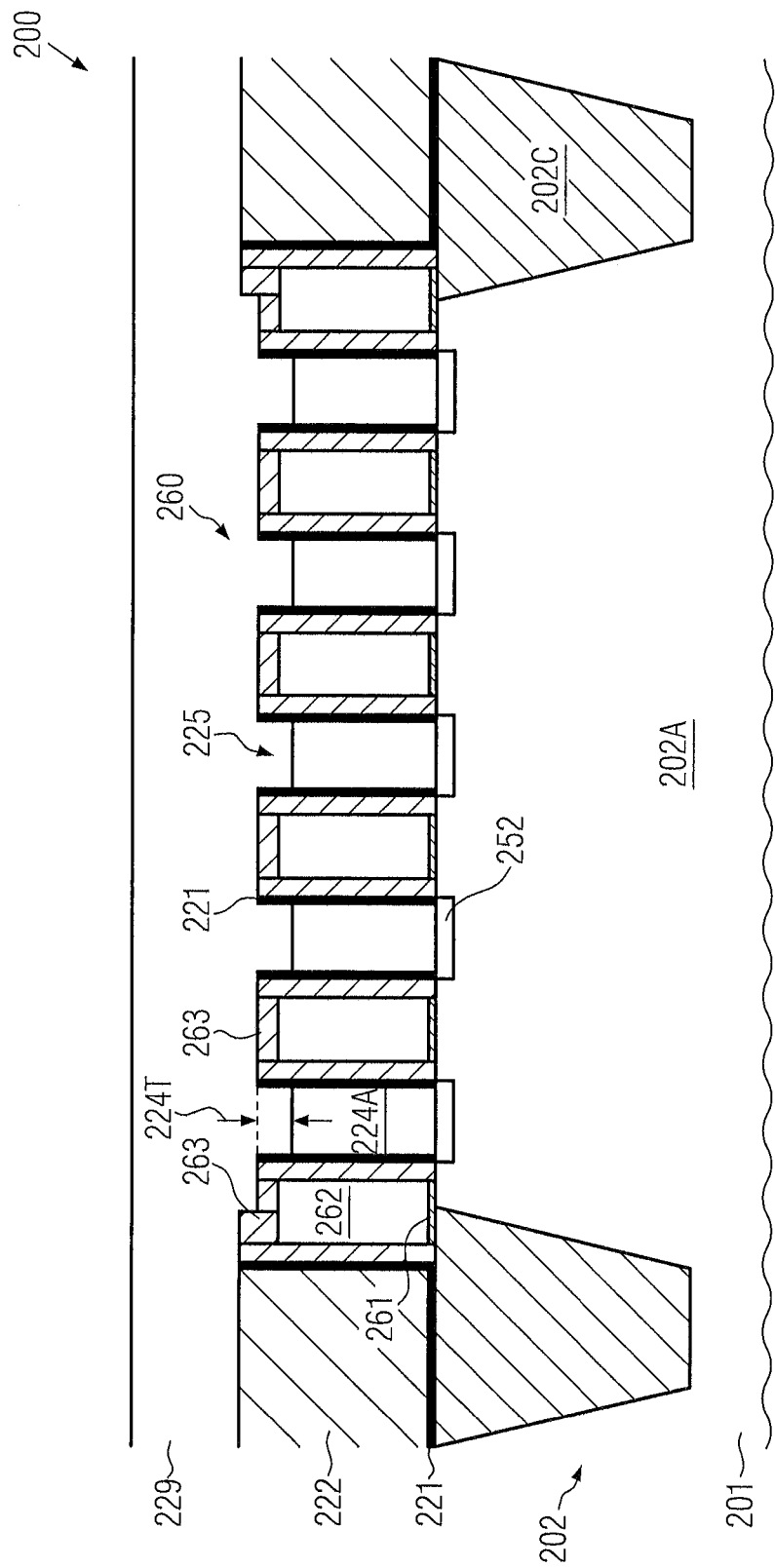
Figure 21:
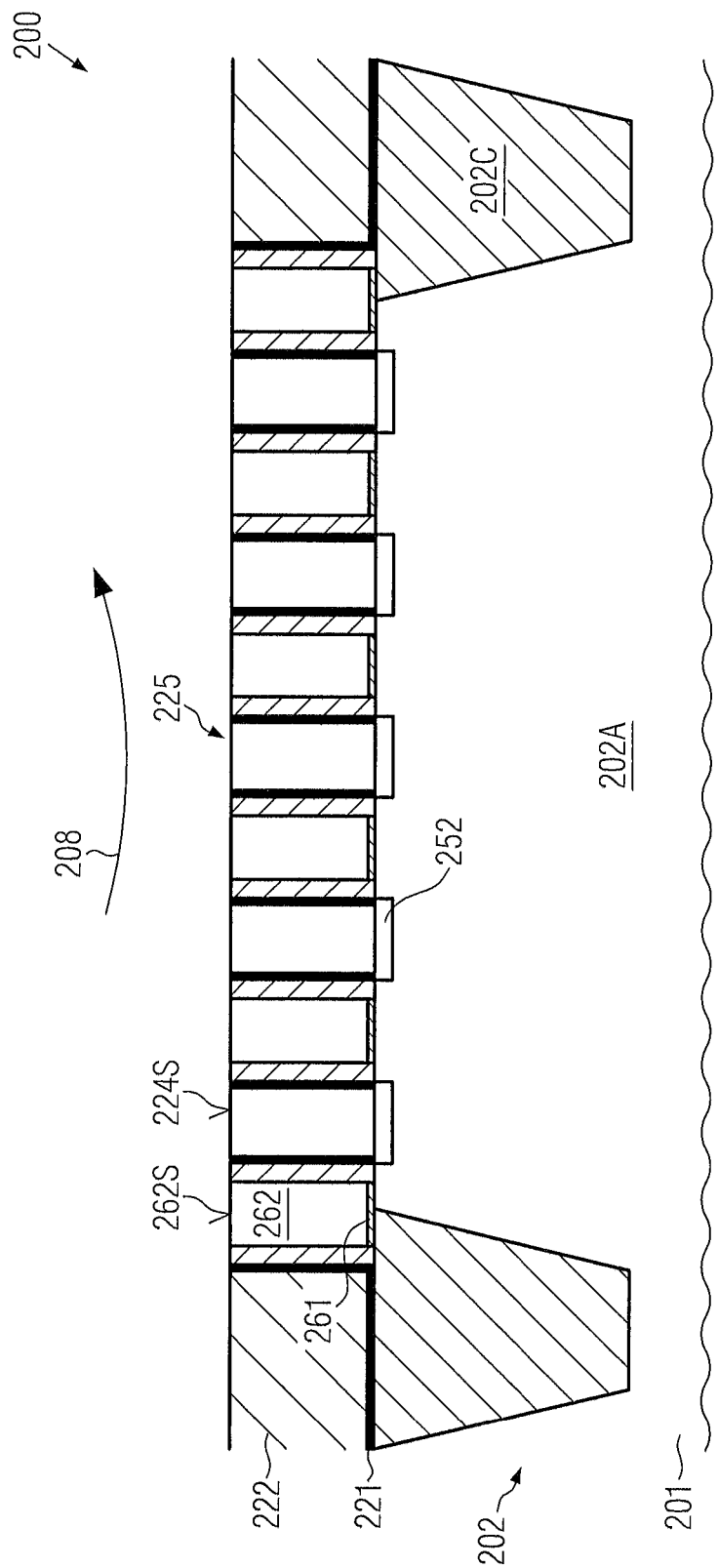

FIG. 2k schematically illustrates the device 200 according to an alternative strategy in order to expose the placeholder material 262. To this end, an excess portion of the material 224A may be removed on the basis of an appropriate etch process, such as a plasma assisted etch process, wherein the process may be continued so as to finally obtain the electrically isolated contact element 225 having a certain degree of recessing 224T with respect to the gate electrode structures 260, which still may comprise at least a portion of the cap layers 263. Thereafter, a further dielectric material 229 may be deposited, for instance on the basis of CVD techniques and the like, thereby reliably filling recesses 224T. In this case, the high degree of compatibility with conventional replacement gate techniques for exposing the placeholder material 262 may be obtained.

FIG. 2l schematically illustrates the device 200 during a removal process 208 in which silicon dioxide and silicon nitride may be preferably polished in accordance with standard replacement gate approaches, wherein, in a final phase, the polysilicon material 262 may be exposed to form the surface areas 262S, while also a surface 224S of the contact elements 225 may be provided. Consequently, also in this case, the device 200 may be prepared for replacing the material 262 by any appropriate material or materials in the presence of the self-aligned contact elements 225.

Figure 2N:
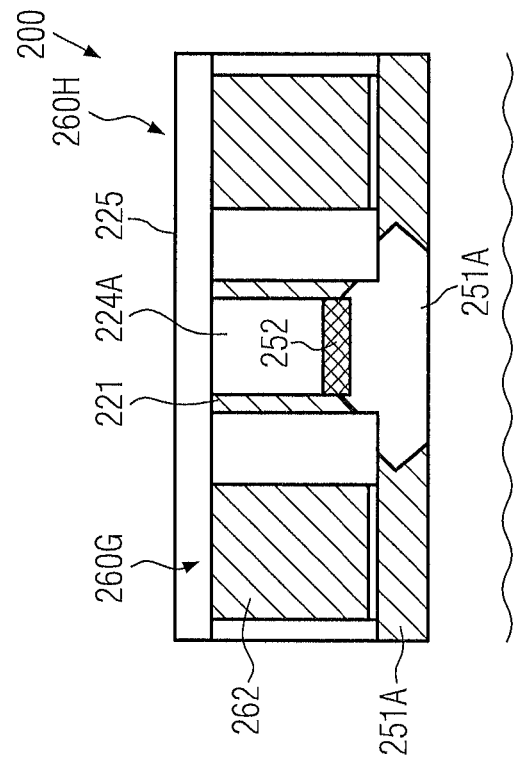
FIGS. 2m-2n schematically illustrate cross-sectional views of the device in which a sacrificial fill material for the contact elements may be used in order to efficiently expose the placeholder material of the gate electrode structures, according to further illustrative embodiments.
Figure 2M:
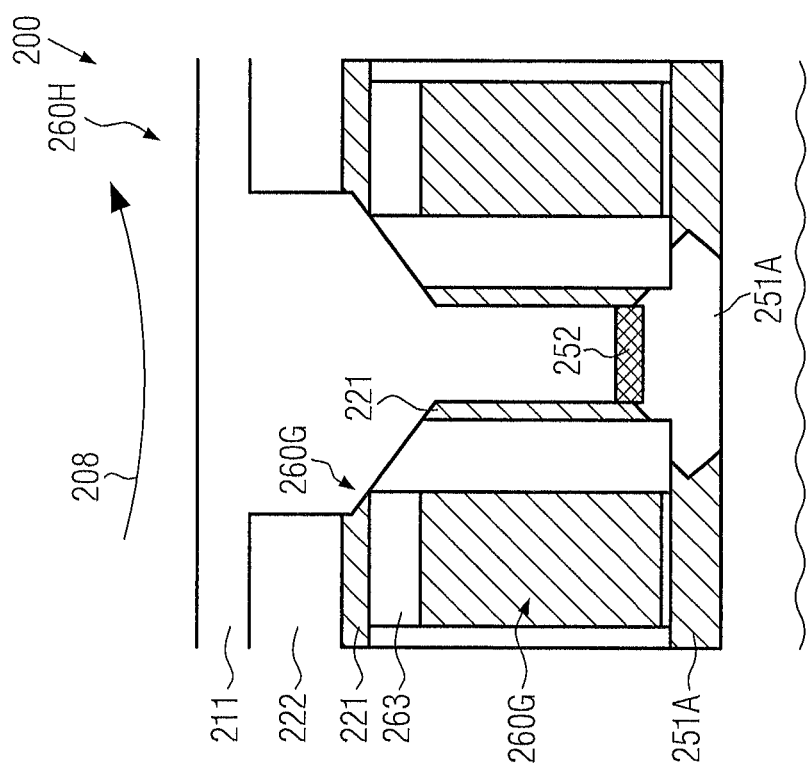
Figure 20:
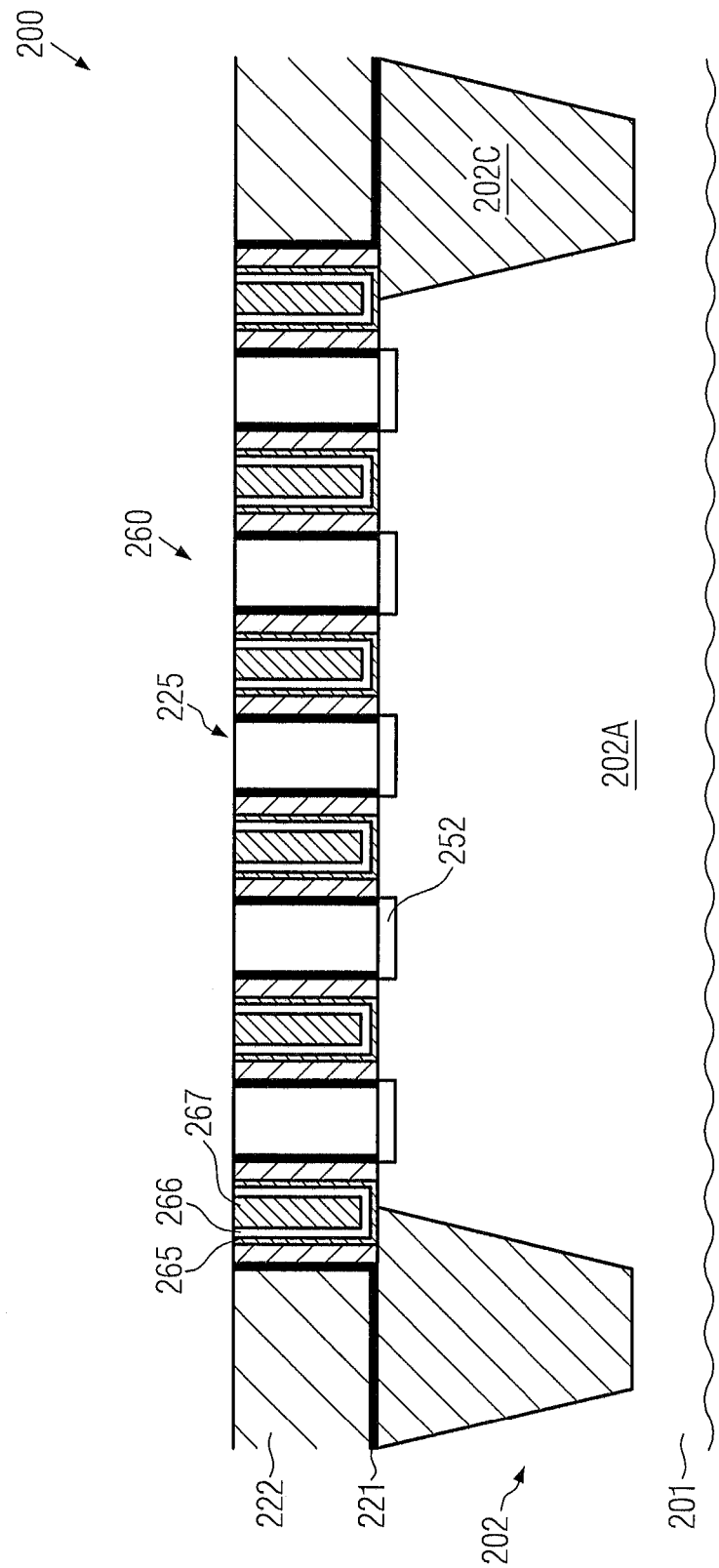

With reference to FIGS. 2m-2n, further illustrative embodiments will be described in which a high degree of compatibility with conventional replacement gate removal processes may be established.

FIG. 2m schematically illustrates the device 200 in a stage in which the previously applied material 222 may be preserved with an extra height, as is also discussed above. Moreover, a sacrificial fill material 211 may be formed in between the gate electrode structures 260G, 260H after forming the metal silicide 252 within the material 251A, which may be accomplished on the basis of process techniques as described above. The sacrificial fill material 211 may be provided in the form of a material that provides similar removal conditions compared to silicon dioxide, silicon nitride and the like, thereby enabling the application of well-established polishing recipes. Moreover, the fill material 211 may be provided on the basis of an appropriate deposition technique with deposition temperatures that are compatible with a device configuration as shown in FIG. 2m. That is to say, a deposition temperature may be below approximately 450-500° C. for NiSi, 550-600° C. for TiSi, and up to 750° C. for CoSi, depending on the material composition of the metal silicide 252. For example, a silicon/germanium material may be efficiently deposited by CVD or low temperature furnace processes while respecting the above temperature constraints. Thereafter, the removal process 208 may be applied so as to increasingly remove the material 211 and the dielectric materials 222, 221 and finally the cap layer 263.

FIG. 2n schematically illustrates the device 200 in a further advanced manufacturing stage. As shown, the placeholder material 262 may have been exposed during the preceding removal process 208 (FIG. 2m) and thereafter an appropriate contact material or materials 224A may be deposited, for instance in the form of tungsten, possibly in combination with any barrier material or materials (not shown) on the basis of well-established deposition techniques. In other cases, any other deposition process may be applied, as is also discussed above. Moreover, if desired, the metal silicide regions 252 may be formed prior to depositing the material 224A, as is also described above, while in other cases the material 252 may be formed after any high temperature processes required for completing the basic transistor configuration. After the deposition of material 224A, any appropriate removal process, such as a polishing process, may be applied in order to remove any excess material and expose the placeholder material 262 so that electrically isolated contact elements 225 may be provided, while the placeholder material 262 is ready for being replaced by one or more sophisticated materials.

FIG. 2o schematically illustrates the device 200 in a further advanced manufacturing stage. As illustrated, the gate electrode structures 260 may comprise at least a metal-containing electrode material 267, for instance in the form of aluminum, aluminum alloys and the like. Moreover, as discussed above, typically an additional work function metal 266, possibly in combination with appropriate conductive barrier materials, may be provided. Moreover, a gate dielectric material 265, which may include a high-k dielectric material, may be provided, possibly in combination with a thin silicon dioxide-based material (not shown) formed so as to provide a superior interface with the active region. To this end, any well-established replacement gate approaches may be applied, which include the deposition of the materials 265, 266 and the patterning thereof, so as to enable the provision of different work function metal species for different transistor types, and finally the material 267 may be deposited and any excess material may be removed by appropriate processes, such as CMP and the like. It should be appreciated that, if desired, any heat treatments required for incorporating the materials 265, 266, 267 and the like may be performed so as to comply with the thermal budget and a maximum temperature, for instance with respect to the metal silicide 252 in order to avoid undue modification of any sensitive materials formed therein, such as nickel platinum silicide and the like. Consequently, the gate electrode structures 260 may be formed in the presence of the self-aligned contact elements 225 while nevertheless preserving a high degree of compatibility with replacement gate approaches.

Figure 2P:
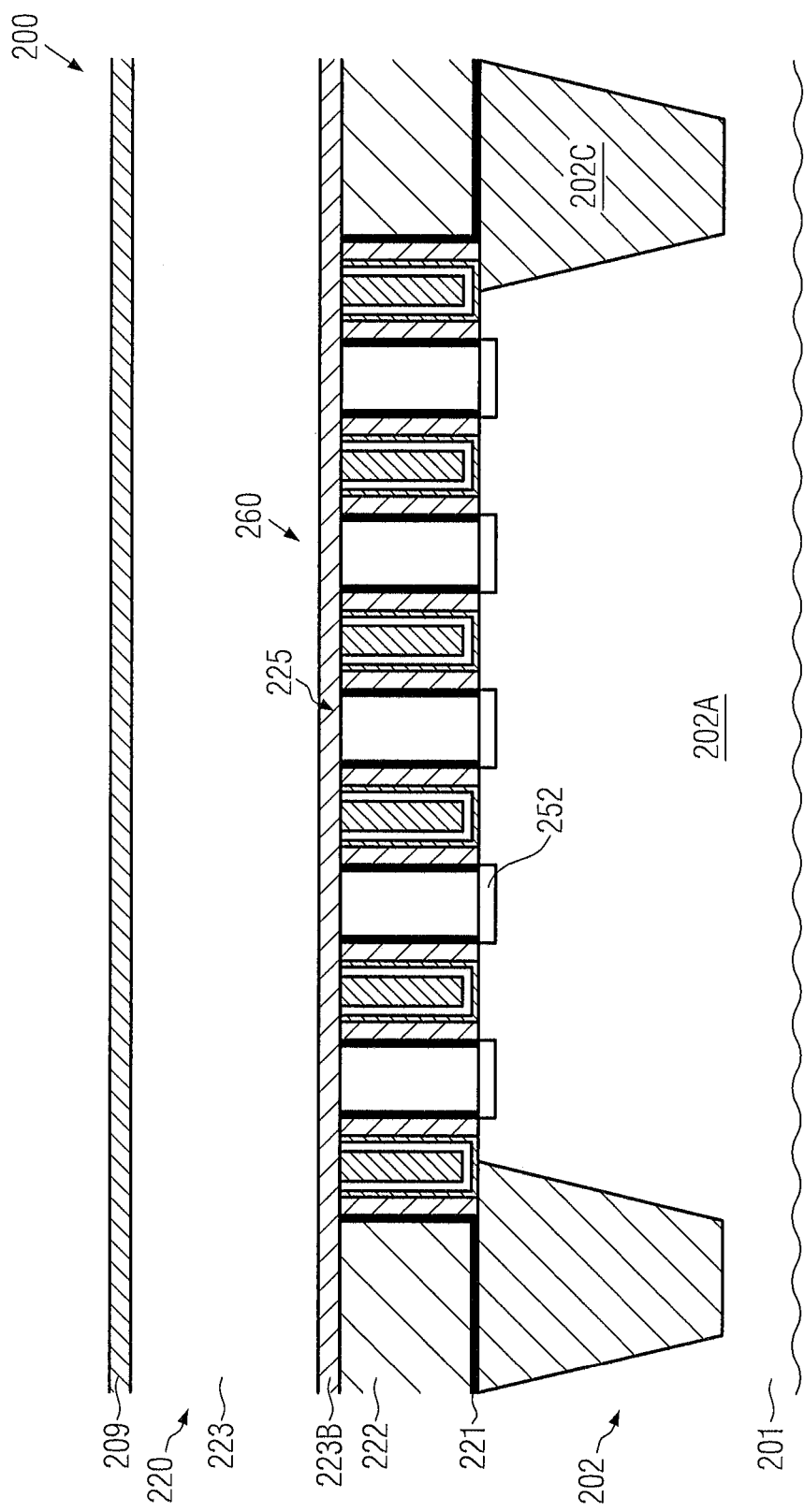

FIG. 2p schematically illustrates the device 200 in a further advanced manufacturing stage. As shown, the contact level 220 may comprise a further dielectric material or material system, for instance provided in the form of a dielectric material 223, such as a silicon dioxide material and the like, in combination with an etch stop material 223B, such as a silicon nitride material. For example, the layer 223B may be provided with a thickness of approximately 30 nm and less, while the additional interlayer dielectric material 223 may have a thickness of 50-100 nm and more, depending on the metal used in forming additional interconnect structures therein so as to connect to the self-aligned contact elements 225 and the gate electrode structures 260. Moreover, a hard mask material 209 may be provided above the material 223 so as to enable a patterning of the materials 223, 223B in accordance with the desired circuit layout. The materials 223B, 223 may be formed on the basis of any well-established deposition techniques and also the hard mask material may be provided by appropriate deposition techniques, for instance in the form of a titanium nitride material, which is known to have a pronounced etch selectivity with respect to a plurality of plasma assisted etch recipes as are typically used for patterning silicon dioxide, silicon nitride and the like.

FIG. 2q schematically illustrates a top view of the device 200 in which the position and lateral size and shape of respective mask openings and thus of interconnect structure features is indicated, which have to be provided in the device 200 so as to connect to the self-aligned contact elements and/or to any gate electrode structures. For example, mask openings 209A may define the lateral position and shape and thus size of interconnect structure portions connecting to lower-lying self-aligned contact elements, while the mask opening 209B may represent an example for providing a "local interconnect," in which a gate electrode structure is to be directly connected to a drain or source region.

FIG. 2r schematically illustrates a cross-sectional view of the device 200 wherein additional contact elements or interconnect portions 226A may be provided on the basis of the mask openings 209A, as shown in FIG. 2q. As illustrated, the elements 226A are formed in the materials 223, 223B and connect to the self-aligned contact elements 225.

FIG. 2s schematically illustrates a further interconnect portion 226B formed in accordance with the mask opening 209B, as shown in FIG. 2q. In this case, a local interconnect is provided since the portion 226B may connect to the gate electrode structure 260G and to the adjacent self-aligned contact element 225.

The semiconductor device as shown in FIGS. 2r-2s may be formed on the basis of well-established lithography and patterning strategies. For example, the hard mask 209 (FIGS. 2p, 2q) may be patterned by using sophisticated lithography techniques, wherein it should be appreciated that any alignment inaccuracies are significantly less critical since a certain degree of misalignment may not significantly affect the overall transistor characteristics, because a metal-metal interface is low-ohmic and not very sensitive to misalignment, other than in conventional strategies, for instance as explained with reference to the contact elements 125 (b) in FIG. 1. After forming the corresponding openings, a desired metal, such as tungsten, copper, copper alloys and the like, possibly in combination with an appropriate barrier or barrier systems, may be deposited, followed by a removal process, such as a CMP process, thereby forming the interconnect portions 226A, 226B, which may also be referred to as metal features of a metal level "zero," which may then be appropriately contacted to a first metallization layer on the basis of appropriate vertical contact structures.

Figure 2T:
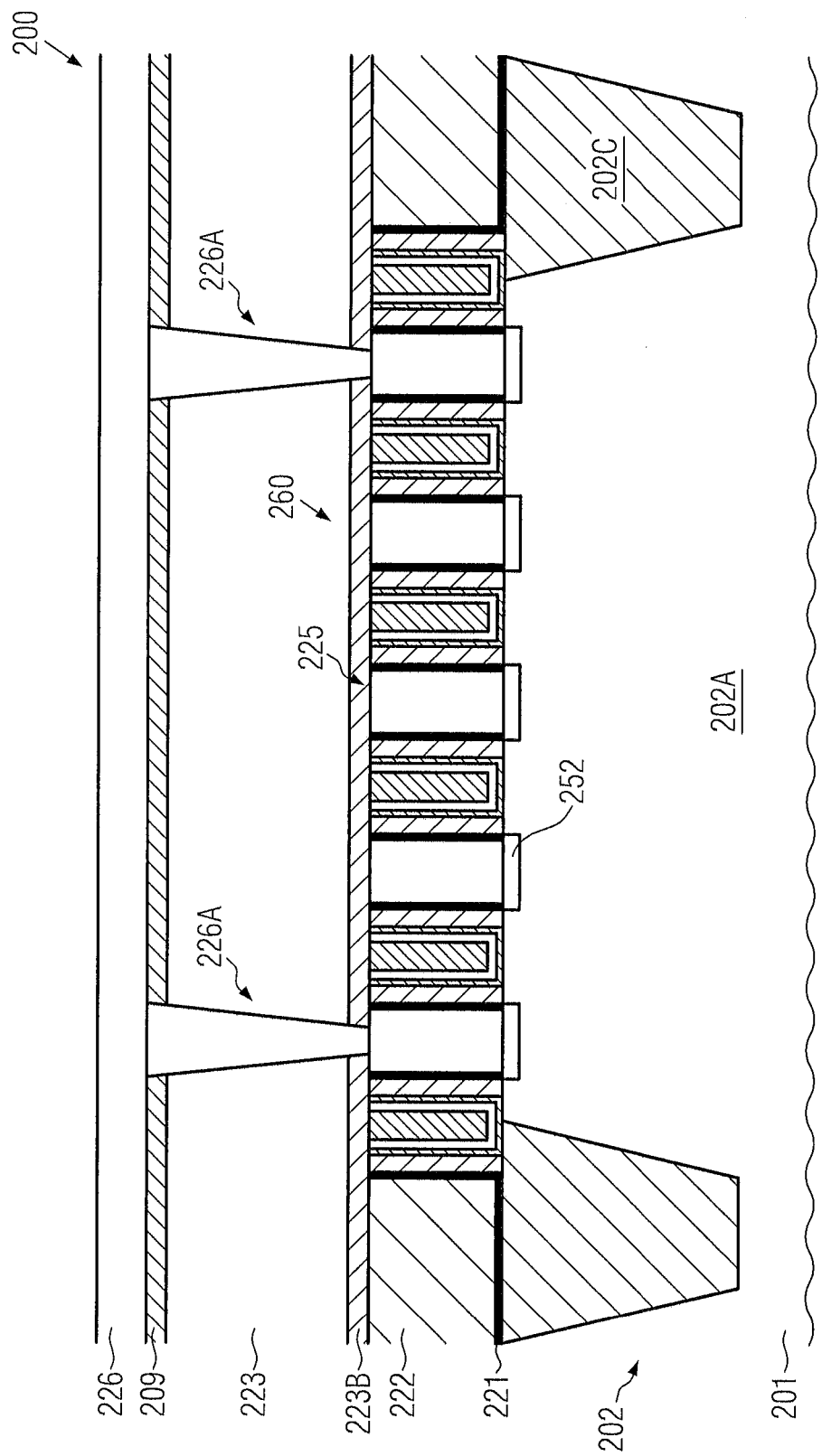

FIG. 2t schematically illustrates the semiconductor device 200 according to other illustrative embodiments in which the metal features of the level "zero" may be formed on the basis of lithography techniques requiring double exposure, double patterning processes for patterning the hard mask 209. For example, lithography processes may be applied so as to define interconnect portions that extend substantially along the transistor width direction, i.e., parallel to the gate electrode structures 260, so that, in a subsequent patterning process, the hard mask 209 may receive respective openings for any such interconnect portions. Thereafter, a further lithography and patterning process may be applied in which elongated openings may be formed in the hard mask 209 that extend substantially perpendicular to the gate electrode structures 260, i.e., along the length direction of the device. Based on the sequentially patterned hard mask 209, the corresponding openings may be etched into the material 223, followed by a further etch step for opening the etch stop layer 223B, thereby exposing the corresponding contact element portions 225 and/or the portions of the gate electrode structures 260 to be contacted. Thereafter, any appropriate metal material 226 may be deposited, as discussed above, and excess material thereof in combination with the hard mask 209 may be removed by CMP and the like. In the cross-sectional area of FIG. 2t, the portions 226A of the interconnect structure are illustrated so as to connect to respective contact elements 225, while perpendicular interconnect portions connecting to one or more gate electrode structures 260 are not shown in the cross-sectional are of FIG. 2t.

FIG. 2u schematically illustrates a top view of the device 200 wherein generally the lateral position of the mask 205 with respect to the lateral dimensions of the active region 202A and the size and position of the interconnect features 226A and of a corresponding perpendicular portion 226B are illustrated. As shown, the portions 226A may connect to the self-aligned contact elements 225 in accordance with overall circuit requirements, while the portions 226B may contact the gate electrode structures 260, for instance for connecting to other gate electrode structures (not shown) or connecting to the portions 226A, as required. By patterning the corresponding hard mask in a sequential manner and providing the portions 226A, 226B having substantially elongated features, also in this case, significantly less critical conditions may be encountered during the lithography and patterning sequence, thereby significantly reducing the probability of creating short circuits and/or leakage paths. Moreover, as shown, the interconnect portions 226B may contact respective gate electrode structures 260 in this illustrative embodiment, laterally outside of the active region 202A, i.e., above the "field region" in accordance with well-established layout strategies. Moreover, as already discussed above, the mask 205 may efficiently restrict the extension of the self-aligned contact elements 225 in the transistor width direction W so as to provide sufficient process margin at the tip portions of the gate electrode structures 260 in order to reliably avoid a short circuit between source and drain regions.

Figure 2V:
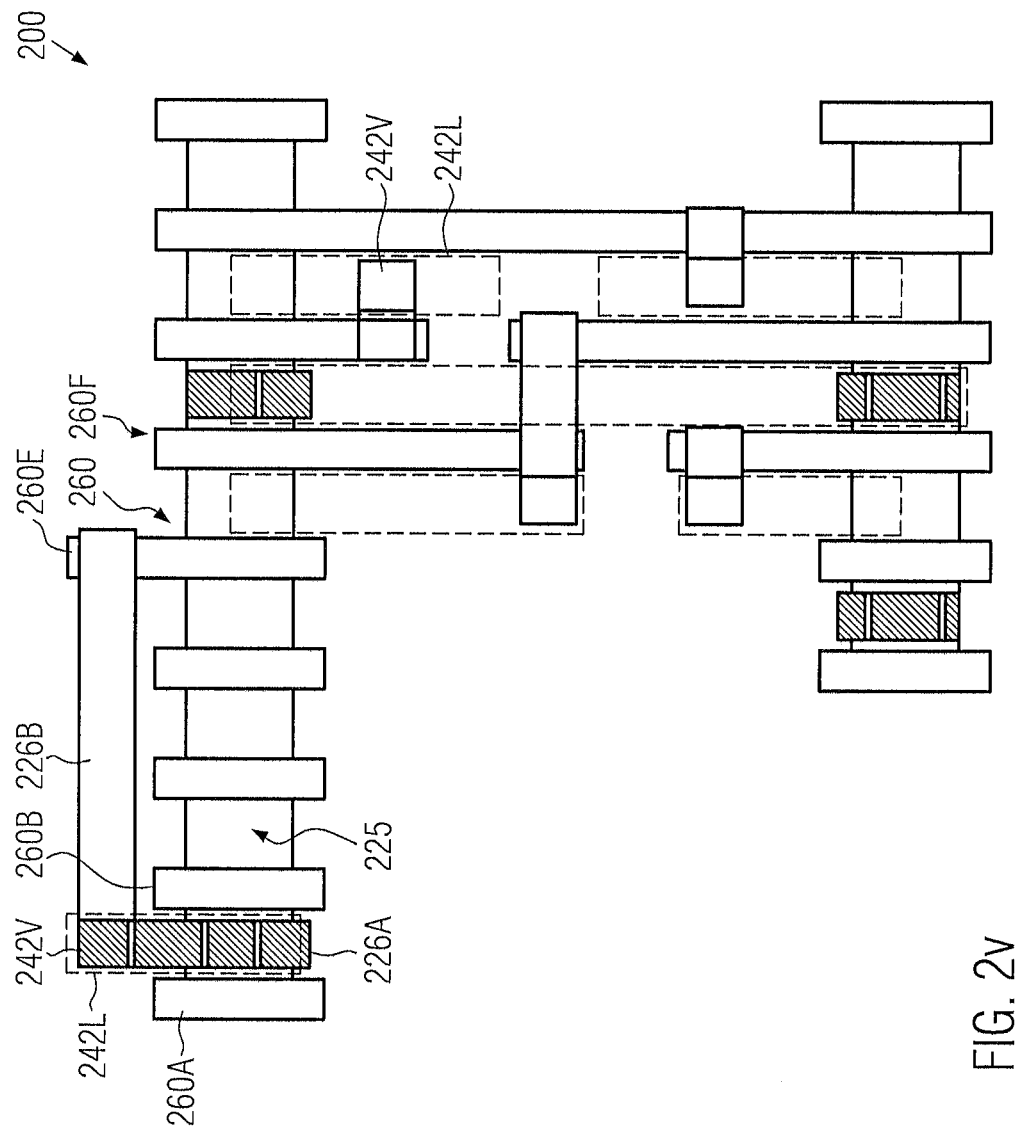
Figure 2W:
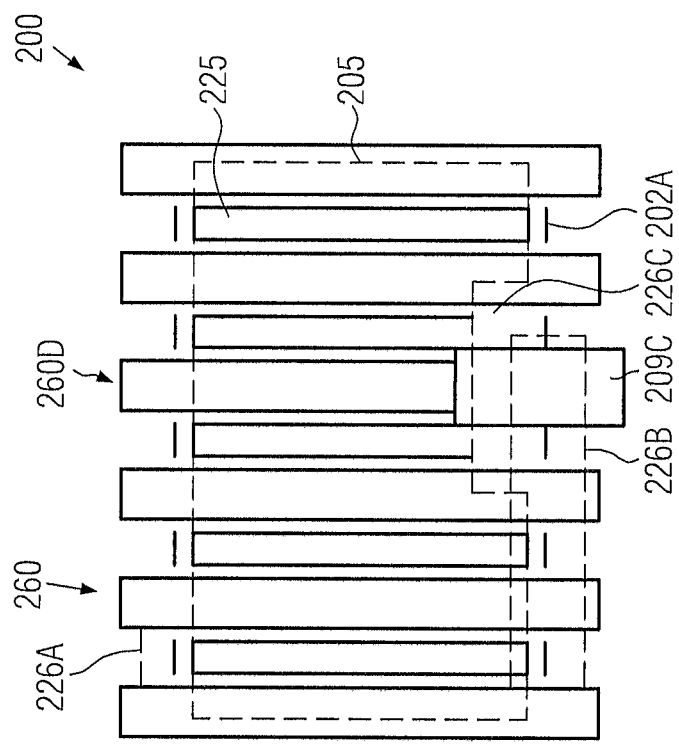
FIG. 2w schematically illustrates a top view of the semiconductor device in which a more compact layout may be obtained by defining appropriate "exclusion" zones for the self-aligned contact elements in order to allow at least a partial routing of gate-to-gate interconnect structures above the active region, according to illustrative embodiments.

FIG. 2v schematically illustrates an illustrative example for a typical layout as may be established on the basis of the self-aligned contact regime described above. As shown, in the upper portion of FIG. 2v, wherein the plurality of gate electrode structures 260 may be provided so as to extend above one or more active regions, self-aligned contact elements 225, the width thereof may be restricted so as to reliably avoid a short circuiting between drain and source regions, may be formed between some of the gate electrode structures 260. Moreover, one of the gate electrode structures, such as the gate electrode structure 260E, has to be contacted with a drain and source region positioned between the gate electrode structures 260A, 260B. Consequently, upon patterning the interconnect structure formed above the self-aligned contact elements 225, the portion 226A and the perpendicular portion 226B may be formed in accordance with manufacturing techniques as described above so as to establish a conductive connection between the self-aligned contact element 225 positioned below the portion 226A and the gate electrode structure 260E. Furthermore, as indicated in dashed lines, metal features of the metallization system (not shown), indicated as metal line features 242L and vias 242V, are typically provided so as to appropriately connect to the interconnect features 226A, 226B in accordance with the overall circuit layout. For example, a portion of 226A may be connected to a metal line 242L by means of one or more vias 242V FIG. 2w schematically illustrates a top view of a connection layout, which may enable significant reduction in the floor space required for establishing gate-to-gate connections. As discussed above, typically any gate electrode structures, such as the gate electrode structure 260E in FIG. 2v, may be contacted over field in order to reduce the probability of creating any short circuits or leakage paths. Based on the precisely self-aligned contact elements 225, which may extend along a significant portion of the entire width of the active region 202A, however, it may be possible to define an area above the active region 202A which may be excluded from forming a contact portion therein, thereby providing sufficient alignment margins in contacting a gate electrode structure. As shown, the gate electrode structure 260D may have to be contacted with the interconnect portion 226B, which in turn may connect to the interconnect portion 226A, which may be formed above the corresponding self-aligned contact element 225, as previously explained. In order to appropriately contact the gate electrode structure 260D, the corresponding etch process has to ensure a portion of the dielectric material may be preserved, such as the etch stop material, upon forming the corresponding opening for the portion 226B, while in the vicinity of the gate electrode structure 260D, any dielectric material is to be removed. To this end, an additional lithography step may be applied, wherein, however, a certain tolerance in alignment accuracy may be taken into consideration by defining a corresponding exclusion zone 226C with respect to the self-aligned contact elements 225. That is, the exclusion zone 226C may be comprised of interlayer dielectric material and does not contain any conductive contact material as is used for forming the self-aligned contact elements 225. To this end, the corresponding mask 205 may have any appropriate shape, for instance in the present case the exclusion zone 226C is formed around a portion of the gate electrode structure 260D, thereby restricting the width of the corresponding self-aligned contact elements 225, which, however, nevertheless provides sufficient contact performance since the remaining portion of these contact elements 225 nevertheless results in a desired low contact resistivity to the underlying active region 202A. Consequently, upon patterning the dielectric material formed above the self-aligned contact elements 225, a further mask opening 209C may be applied during the overall patterning sequence, which exposes the corresponding gate electrode structure while nevertheless providing efficient tolerances when positioning the interconnect feature 226B, which may thus be routed, at least partially, above the active region 202A, thereby reducing the overall floor space for establishing the connection between the gate electrode structure 260D and the contact element 225 formed below the interconnect portion 226A.

Figure 2X:
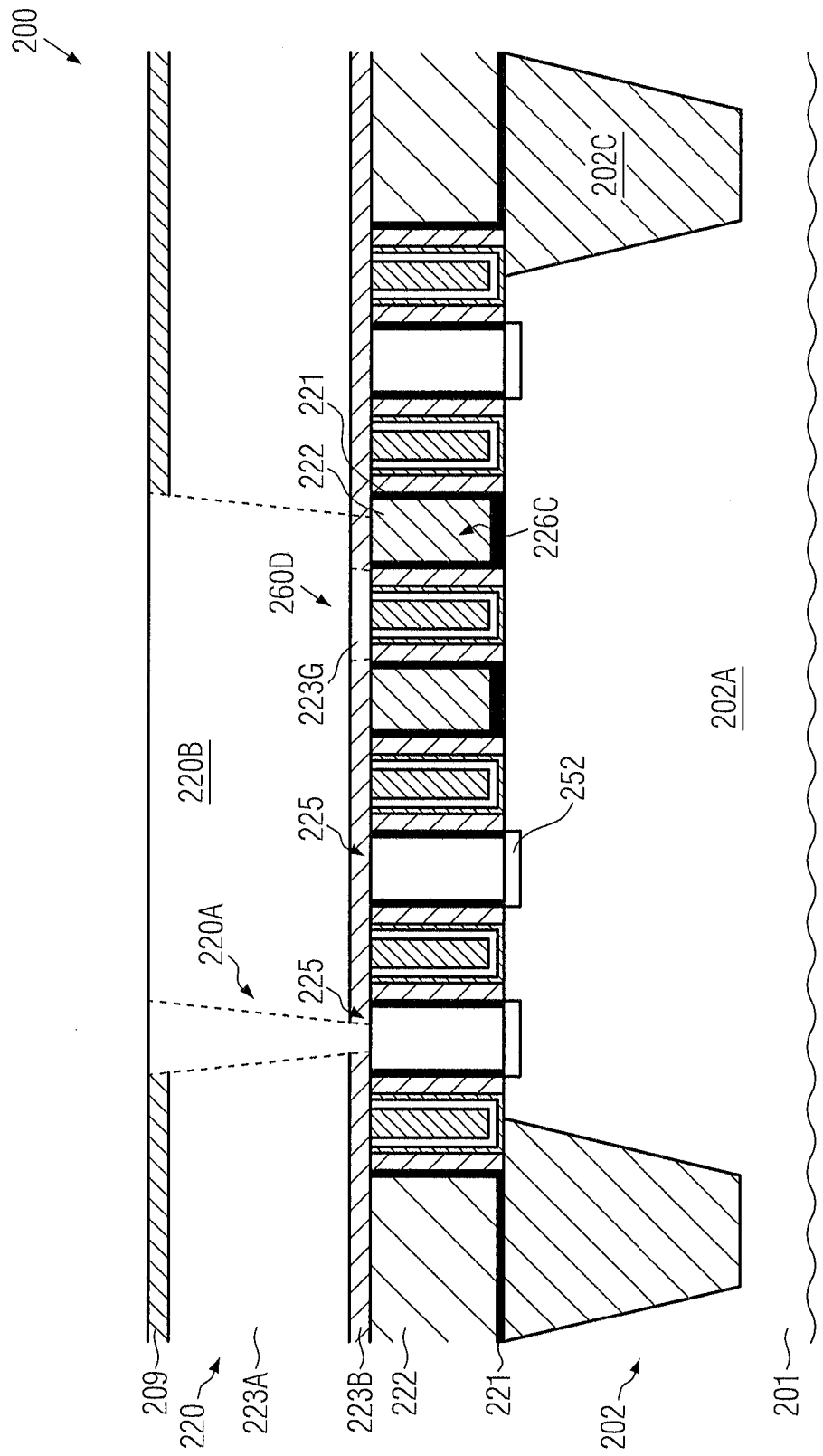
FIGS. 2x-2y schematically illustrate cross-sectional views of the semiconductor device with self-aligned contact elements and corresponding exclusion zones and the resulting interconnect structure for connecting to the gate electrode structures and to the self-aligned contact elements, according to illustrative embodiments.

FIG. 2x schematically illustrates a cross-sectional view taken along the transistor length direction within the exclusion zone 226C of FIG. 2w. As shown, a first opening 220A may be formed in the interlayer dielectric level 220 so as to connect to the underlying self-aligned contact element 225, as is indicated in FIG. 2w for the interconnect feature 226A. Similarly, a second opening 220B may be provided so as to correspond to the interconnect feature 226B of FIG. 2w, wherein, however, the etch stop layer 223B is preserved within a significant portion of the opening 220B. Furthermore, within the opening 220B, a further opening 223G is provided, which extends through the etch stop layer 223B so as to connect to the underlying gate electrode structure 260D in accordance with the mask 209C of FIG. 2w.

The semiconductor device 200 as shown in FIG. 2x may be formed on the basis of the following processes. First, the hard mask 209 may be appropriately patterned so as to form an opening corresponding to the opening 220B and an etch process may be applied in order to etch through the material 223 while stopping on the etch stop layer 223B. After any cleaning processes, the mask 209 may be further patterned so as to define the shape and position of the opening 220A, which may subsequently be formed by etching through the materials 223 and 223B, followed by a further lithography process in order to define the opening 209C (FIG. 2w), followed by an appropriate etch process so as to finally etch through the etch stop layer 223B and thus connect to the gate electrode structure 260D, however, without connecting to any conductive material of self-aligned contact elements, due to the presence of the exclusion zone 226C, i.e., the dielectric materials 222 and 221 that have been preserved in the exclusion zone 226C, as discussed above.

Figure 2Y:
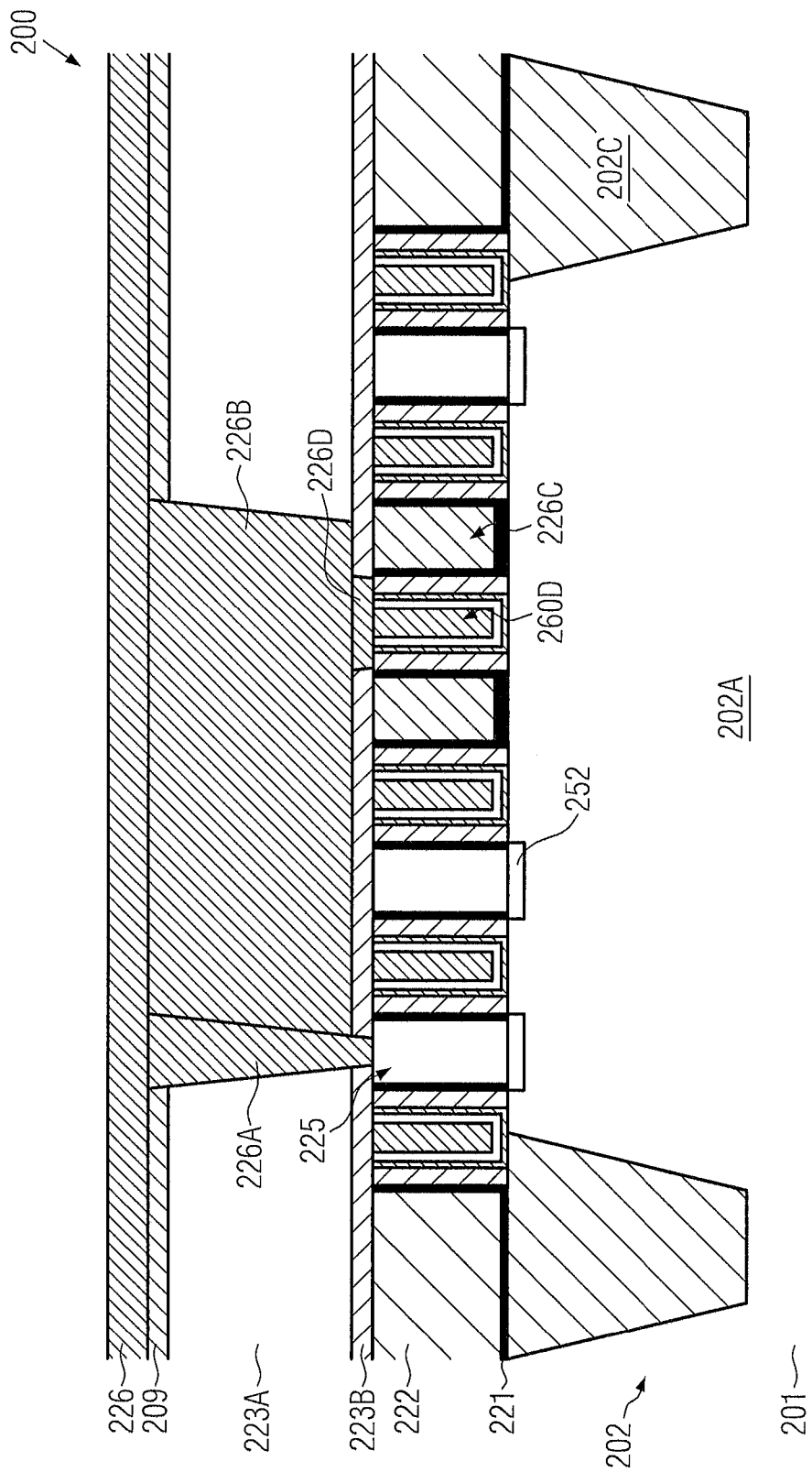

FIG. 2y schematically illustrates a cross-sectional view of the device 200 in a further advanced manufacturing stage. That is, the conductive material or materials 226 may be deposited on the basis of any appropriate deposition regime as discussed above, thereby forming the interconnect portion 226A so as to connect to the self-aligned contact element 225, while also forming the interconnect portion 226B which in turn connects to the portion 226A, according to the specific circuit layout, whereas a further interconnect portion 226D connects to the gate electrode structure 260D. The portion 226D may thus be reliably isolated from any adjacent conductive contact material due to the presence of the isolation regions or exclusion zone 226C. Thereafter, any excess material as well as the hard mask 209 may be removed, as described above.

Figure 2Z:
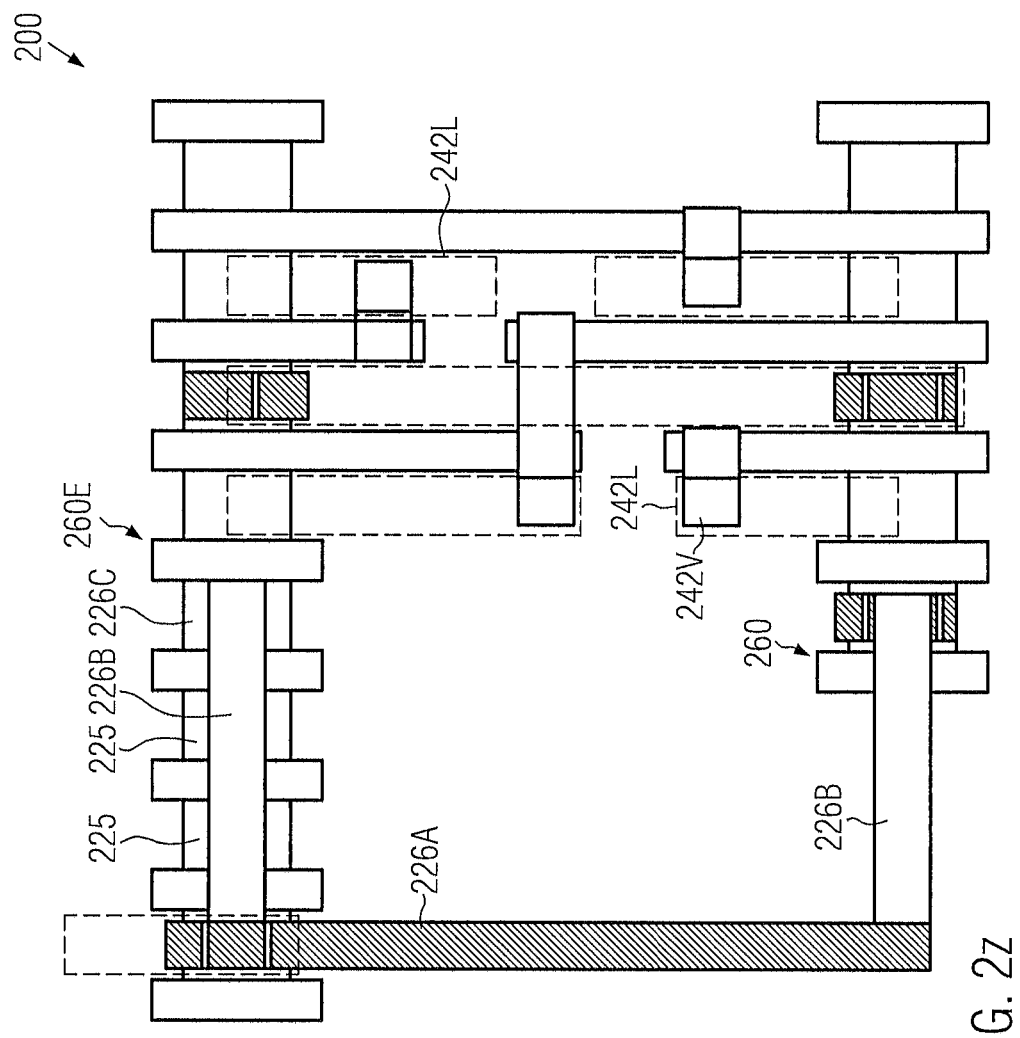
FIG. 2z schematically illustrates a top view of a compact circuit layout in which interconnect portions connecting to gate electrode structures are routed above the active region, thereby reducing the overall floor space of the layout according to illustrative embodiments.

FIG. 2z schematically illustrates a top view of an illustrative layout example, which may substantially correspond to the layout as shown in FIG. 2v, wherein, however, a space-efficient configuration may be achieved by, for instance, providing the exclusion zone 226C adjacent to the gate electrode structure 260E, wherein, if contacting of the associated drain and source regions is not required, the exclusion zone 226C may extend across the entire width of an underlying active region, thereby allowing even a substantially central positioning of the interconnect portion 226B above the active region. Consequently, based on a manufacturing sequence as described above with reference to FIGS. 2x and 2y, the gate electrode structure 260E may be contacted upon forming the interconnect portion 226B without requiring a contacting of the gate electrode structure 260E laterally outside of the active region, as is for instance shown in FIG. 2v. Similarly, the lower portion of FIG. 2z of the gate electrode structures 260 may allow a routing of an associated portion 226B by avoiding the opening of the etch stop material upon forming the portion 226B, which may thus be used to appropriately connect to a corresponding portion 226A, which in turn finally connects to the portion 226B as connected to the gate electrode structure 260E. Hence, by implementing an additional lithography process, a highly space-efficient routing of the interconnect structure portions 226A, 226B may be achieved, wherein, in particular, portions 226B may be routed at least partially above corresponding active regions.

With reference to FIGS. 3a-3u, further illustrative embodiments will now be described in which the conductive contact material for self-aligned contact elements may be provided in an early manufacturing stage.

FIG. 3a schematically illustrates a semiconductor device 300 in which gate electrode structures 360A, 360B, 360C may extend across active regions 302A, 302B, which may be separated by an isolation region 302C. With respect to the components described so far, the same criteria may apply as previously explained.

FIG. 3b schematically illustrates a cross-sectional view taken along the section Mb of FIG. 3a. As illustrated, the gate electrode structures 360A, 360B, 360C may comprise a placeholder material 362, which may be confined by a spacer 364 and a dielectric cap layer or layer system 363, as is also discussed above with reference to the devices 100 and 200. Moreover, if required, a dielectric layer 361 may be provided. Furthermore, drain and source regions 351 may be formed in the active region 302B, for instance in the form of a semiconductor alloy embedded therein and the like. Moreover, a metal silicide 352 may be formed in and above the regions 351 and may have any appropriate material composition, for instance nickel silicide, nickel platinum silicide and the like.

FIG. 3c schematically illustrates the device 300 along the section as indicated by IIIc in FIG. 3a. In this illustration, the active regions 302B, 302A comprising, in this area, the metal silicide regions 352, are separated by the isolation region 302C.

The semiconductor device 300 as shown in FIGS. 3a-3c may be formed on the basis of any appropriate manufacturing strategy, as is for instance also described above when referring to forming active regions, forming gate electrode structures thereon and completing the final transistor configuration, i.e., forming the drain and source regions 351. Thereafter, the metal silicide regions 352 may be formed on the basis of any appropriate silicidation regime. In this manner, a high degree of compatibility with conventional transistor manufacturing techniques may be achieved.

Figure 3D:
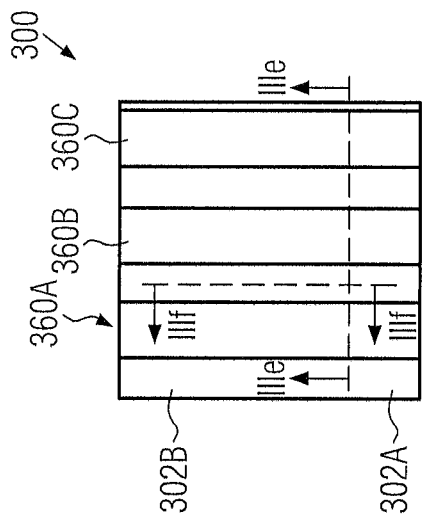
FIGS. 3a-3u schematically illustrate top views and associated cross-sectional views of a semiconductor device during various manufacturing stages in which self-aligned contact elements may be provided by forming the contact material prior to the deposition of the interlayer dielectric material, according to still further illustrative embodiments.

FIG. 3d schematically illustrates a top view of the device 300 in a further advanced manufacturing stage in which an appropriate contact material 324 may be formed above the active regions.

Figure 3F:
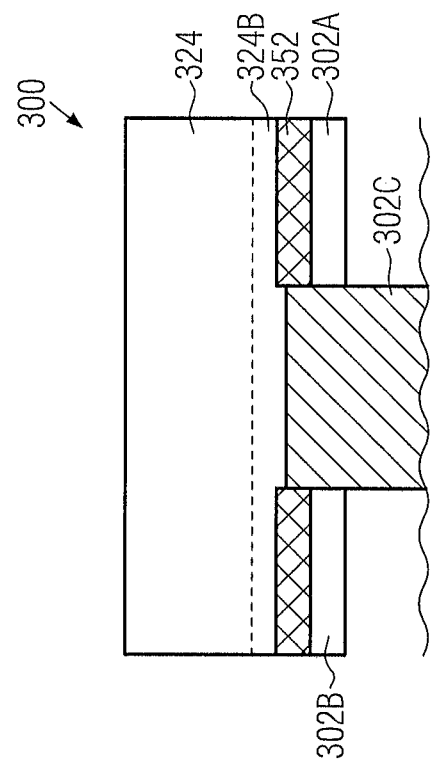
Figure 3E:
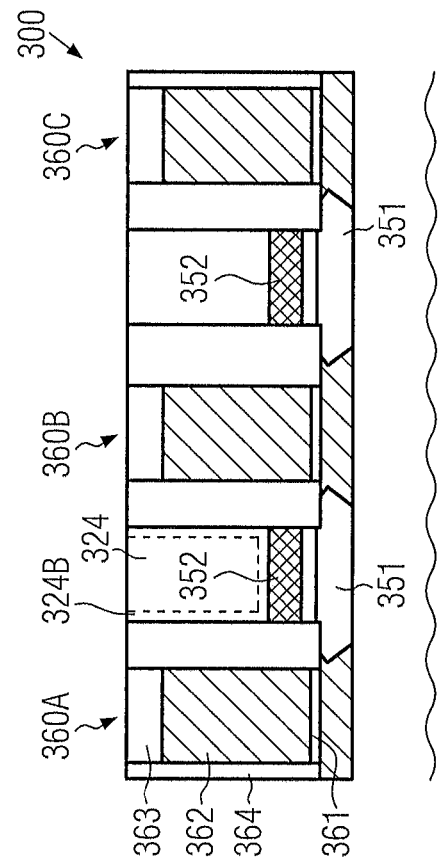

FIGS. 3e and 3f schematically illustrate cross-sectional views corresponding to the sections IIIe, IIIf, respectively. Thus, as shown, the conductive contact material 324 may be formed between the gate electrode structures 360A, 360B, 360C, possibly in combination with any barrier material 324B, as is also discussed above. Due to the non-selective deposition of the material 324, the material may also be formed on and above the isolation structure 302C, as shown in FIG. 3f.

With respect to any manufacturing strategies for forming the material 324 in combination with the material 324B, the same criteria may apply as previously discussed. Consequently, after removing any excess material, thereby providing a substantially planar surface topography, the further processing may be continued with superior conditions with respect to performing critical lithography processes. The removal of any excess material may be accomplished on the basis of CMP, etch techniques and the like.

Figure 3G:
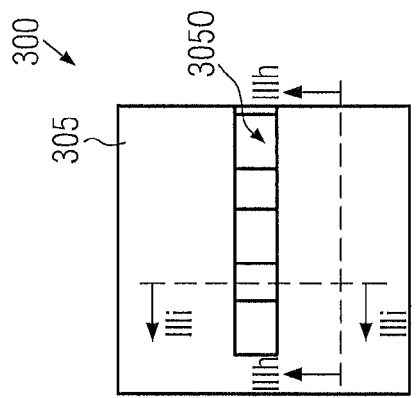

FIG. 3g schematically illustrates the device 300 with an appropriate mask 305 having an opening 305O, which may define the shape and position of an area of the device 300 in which the previously formed conductive contact material is to be "interrupted" in order to provide appropriately dimensioned isolation regions. For example, a slit-like opening is shown in FIG. 3g, which may be accomplished by depositing an appropriate mask material, such as silicon dioxide and the like, followed by a resist material and the like, which may then be patterned so as to form a desired opening, which may not necessarily have the desired dimensions. Thereafter, the actual mask may be patterned in accordance with the lithography mask and, if a further reduction in lateral dimensions is considered appropriate, a further deposition process may be applied, followed by an anisotropic etch process, thereby further reducing the dimensions of the resulting opening 305O, if required. Consequently, by appropriately selecting the shape and lateral dimensions of the mask opening 305O, a corresponding portion of the material 324 may be exposed.

Figure 3I:
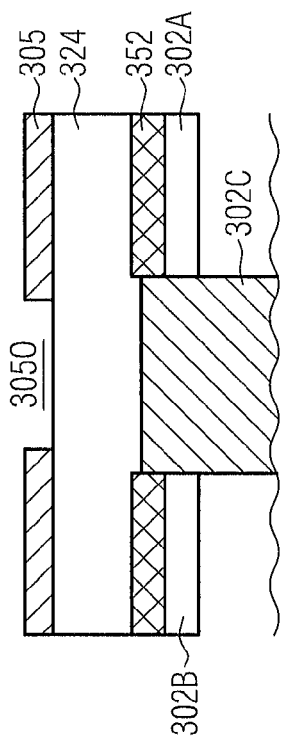
Figure 3H:
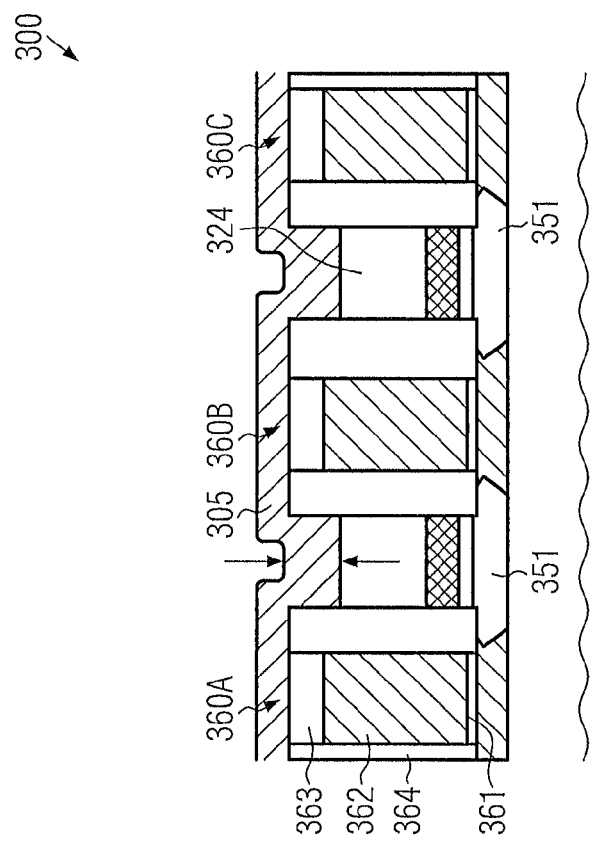

FIGS. 3h and 3i schematically illustrate the device 300 after providing the etch mask 305 and patterning the same. As shown in FIG. 3h, the mask 305 may thus substantially completely cover the gate electrode structures 360A, 360B, 360C and the corresponding intermediate spaces since here highly conductive contact elements are required. Moreover, in the embodiment shown, the contact material 324 may have been recessed with respect to the gate electrode structures 360A prior to forming the mask 305, which may be accomplished by well-established etch recipes. In this case, a portion of the mask material 305 may be maintained so as to provide a high degree of compatibility during a subsequent replacement gate approach.

FIG. 3i schematically illustrates the opening 305O in the mask 305, which may be positioned above the isolation region 302C in order to define an area in which the conductive material 324 is to be interrupted.

Figure 3J:
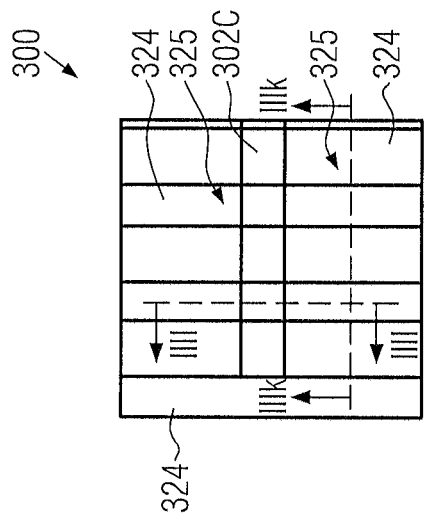
Figure 3L:
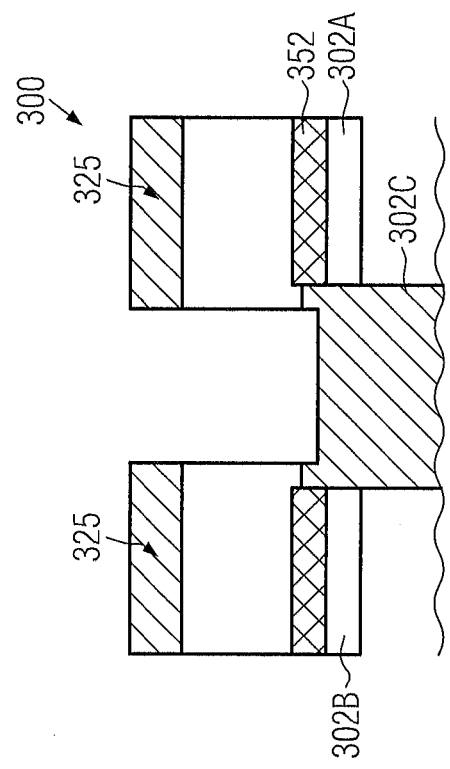
Figure 3K:
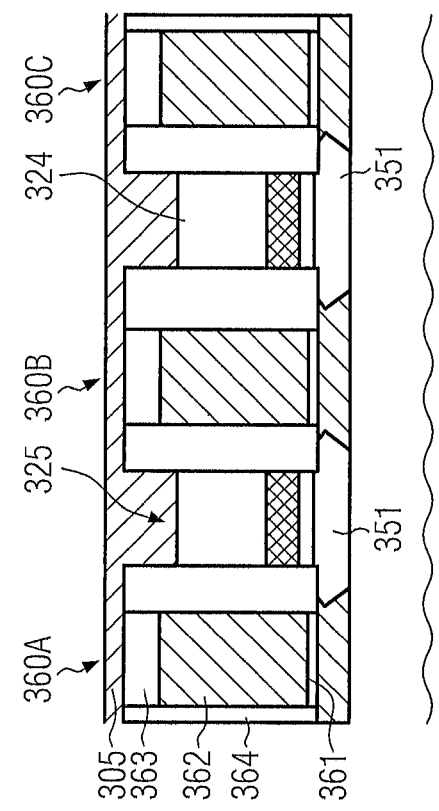

FIGS. 3j, 3k and 3l schematically illustrate the device 300 in a further advanced manufacturing stage. As shown, the material 324 may be etched selectively with respect to the mask 305 so as to form isolated contact elements 325, as shown in FIGS. 3k and 3l.

Figure 3M:
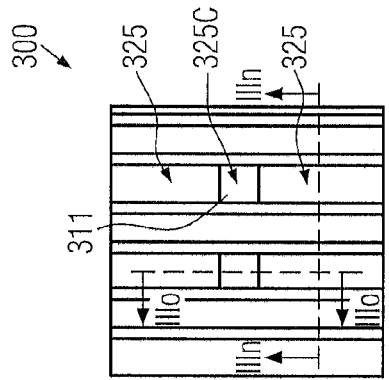
Figure 3O:
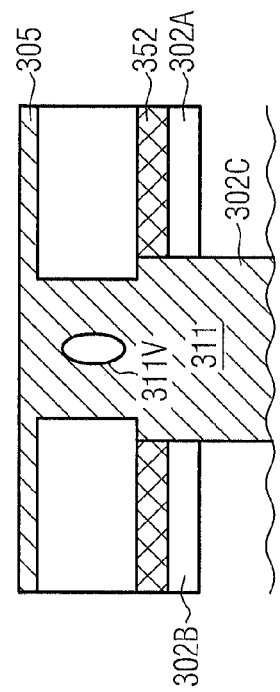
Figure 3N:
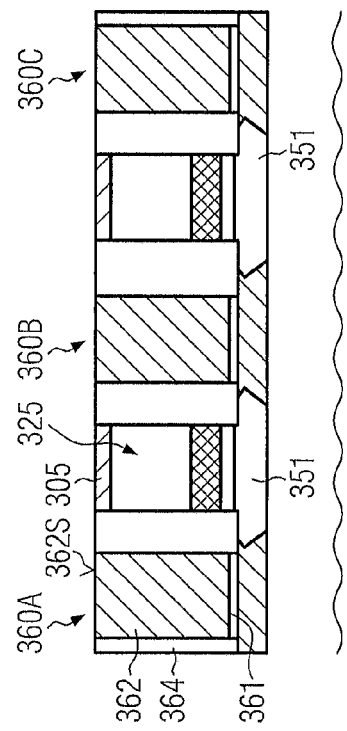

FIGS. 3m, 3n and 3o schematically illustrate the device 300 in a further advanced manufacturing stage. An insulating material, i.e., an interlayer dielectric material, may be filled into respective openings 325C previously formed upon selectively removing the material 324, as discussed above. To this end, any well-established process techniques may be applied, for instance by depositing silicon dioxide material and the like. It should be appreciated that the creation of any voids within the openings 325C may not be critical since the conductive contact material 324 has already been deposited and may thus not result in buried tungsten channels, as may frequently be caused in conventional contact regimes. Thereafter, any excess material may be removed, which may be accomplished on the basis of well-established replacement gate removal processes. During the corresponding removal process, also the placeholder materials of the gate electrode structures may be exposed.

FIGS. 3n and 3o schematically illustrate the cross-sectional views corresponding to the manufacturing stage as described above. Hence, the polysilicon material 362 may have an exposed surface 362S, while in some cases material residues may be formed above the self-aligned contact elements 325, which may represent residues of the previously formed etch mask 305 or of an interlayer dielectric material 311 (FIG. 3o), which may have been deposited so as to fill the openings 325C with dielectric material, wherein the occurrence of any voids 311V may not affect the further processing.

FIGS. 3p, 3q and 3r schematically illustrate the device after completing a replacement gate process sequence. Thus, the gate electrode structures 360 may comprise an appropriate material system, for instance comprising a high-k dielectric material 365 in combination with a work function metal species and any conductive barrier materials 366 and a highly conductive electrode metal, such as aluminum, aluminum alloys and the like.

FIGS. 3q and 3r schematically illustrate cross-sectional views of the devices which comprise the sophisticated high-k metal gate electrode structures 360A, 360B, 360C. Moreover, as shown in FIG. 3r, the high-k dielectric material 365 may still be formed above the interlayer dielectric material 311, which in turn connects to the isolation region 302C. It should be appreciated that the material 365 may be removed from above any horizontal portions, if considered appropriate. With respect to performing replacement gate approaches, it may also be referred to process strategies as described with reference to the devices 100 and 200.

FIGS. 3s, 3t and 3u schematically illustrate the device 300 in a further advanced manufacturing stage. As shown in FIG. 3s, corresponding interconnect portions 326 may be provided so as to connect to the underlying self-aligned contact elements 325, as required by the overall circuit layout. To this end, any appropriate interlayer dielectric material or material system may be formed above the isolation region 325C, i.e., the area in which the contact material has been interrupted and in which an appropriate interlayer dielectric material has been filled in. Thereafter, the material may then be patterned so as to form respective openings corresponding to the lateral shape and position of the interconnect features 326, which may be formed by depositing any appropriate metal, such as copper, tungsten and the like, possibly in combination with appropriate barrier materials.

FIGS. 3t and 3u schematically illustrate cross-sectional views of the devices in this manufacturing stage. As shown, the interconnect portions 326 may connect to the self-aligned contact elements 325 according to the layout as, for instance, specified in FIG. 3s. Hence, the portions 326 extend to a dielectric material 323, such as a silicon dioxide material, and to an etch stop material 323B, such as a silicon nitride material and the like. Similarly, as shown in FIG. 3u, the portions 326 and the self-aligned contact elements 325 are reliably isolated by the materials 323 and 323B.

It should be appreciated that also respective interconnect features may be provided so as to connect to any of the gate electrode structures 360, which may, for instance, be accomplished by defining appropriate exclusion zones in which also the contact material may be removed upon patterning the self-aligned contact elements 325. In this manner, the corresponding exclusion zones may be positioned at any desired lateral position, for instance outside of any active regions or above any active regions, as is also described before with reference to the semiconductor device 200.

As a result, the present disclosure provides manufacturing techniques and semiconductor devices in which self-aligned contact elements may be formed in combination with replacement gate electrode structures in that the contact elements may be formed prior to replacing a placeholder material of the gate electrode structures. In this manner, sophisticated high-k metal gate electrode structures in complex semiconductor devices may be provided for high-performance transistors, as, for instance, required for logic circuit portions, wherein any negative effects of the self-aligned contact regime on the replacement gate electrode structures may be avoided. Moreover, in some illustrative embodiments, a very space-efficient routing of gate-to-gate or gate-to-active interconnections may be achieved, thereby enabling a further reduction in size of complex semiconductor devices for given minimum transistor dimensions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a contact element laterally adjacent to a gate electrode structure so as to connect to one of a drain region and source region formed in an active region of a semiconductor device, said gate electrode structure comprising a placeholder electrode material covered by a dielectric cap layer;
   wherein forming said contact element comprises: forming a dielectric material above said drain and source regions and laterally adjacent to said gate electrode structure;
   forming a contact opening in said dielectric material so as to expose at least a portion of said one of a drain region and a source region; forming a sacrificial fill material in said contact opening; performing a common removal process to remove said dielectric cap layer and a portion of said sacrificial fill material so as to expose a surface of said placeholder material; and
   replacing said placeholder electrode material at least with a metal-containing electrode material in the presence of said contact element.

2. The method of claim 1, wherein forming said contact element further comprises providing a hard mask above said dielectric material so as to define a lateral shape and position of said contact opening.

3. The method of claim 2, wherein a lateral shape and a lateral position of said contact opening are selected so as to be within lateral boundaries of said active region along a width direction of said active region.

4. The method of claim 1, wherein performing said common removal process in the presence of said sacrificial fill material so as to expose a surface of said placeholder material comprises the application of well-known established polishing recipes.

5. The method of claim 1, wherein forming said contact element further comprises removing said sacrificial fill material in said contact opening and forming a conductive contact material in said contact opening.

6. The method of claim 1, wherein forming said contact element further comprises forming a conductive contact material in said contact opening prior to removing said dielectric cap layer from above said placeholder material.

7. The method of claim 1, wherein forming said contact element further comprises forming a metal silicide in a portion of said one of a drain region and a source region through said contact opening.

8. The method of claim 1, wherein forming said contact element comprises forming a conductive contact material above said drain and source regions, forming an isolation opening in said conductive contact material and forming a dielectric material in said isolation opening so as to laterally isolate said contact element.

9. The method of claim 8, wherein forming said contact element further comprises forming a metal silicide in said drain and source regions prior to forming said conductive contact material.

10. The method of claim 1, further comprising forming a dielectric layer stack above said gate electrode structure and said contact element and forming an interconnect structure in said dielectric layer stack so as to connect to said electrode metal of said gate electrode structure and to said contact element.

11. The method of claim 10, wherein forming said interconnect structure comprises performing a first lithography process so as to determine a lateral shape and position of a first elongated interconnect portion that extends substantially in parallel to said gate electrode structure and performing a second lithography process so as to determine a lateral shape and position of a second interconnect portion that extends substantially perpendicularly to said gate electrode structure.

12. The method of claim 11, wherein the lateral shape and position of said second interconnect portion are determined so as to enable formation of said second interconnect portion partially within lateral boundaries of said active region.

13. A method, comprising:
   forming a dielectric layer laterally adjacent to a plurality of gate electrode structures formed above an active region of a semiconductor device;
   forming a contact opening in said dielectric material so as to connect to said active region;
   forming a sacrificial fill material in said contact opening;
   performing a common removal process to remove said dielectric material and at least a portion of said sacrificial fill material so as to expose a surface of a placeholder material;
   removing said sacrificial fill material in said contact opening;
   forming a contact element in said contact opening; and
   replacing said placeholder material of said plurality of gate electrode structures at least with a metal-containing electrode material after forming said contact element.

14. The method of claim 13, further comprising, after forming said contact element, forming a second dielectric layer above said dielectric layer and forming an elongated interconnect portion in said second dielectric layer so as to connect to one or more of said gate electrode structures, wherein said elongated interconnect portion is positioned above said active region so as to be laterally at least partially within said active region.

15. The method of claim 14, wherein forming said contact element comprises determining a lateral shape and position of an exclusion zone that includes a contact area of said one or more gate electrode structures and avoiding forming said contact opening in said exclusion zone.

16. The method of claim 13, further comprising exposing a surface of said placeholder material after forming said contact opening and prior to forming said contact element.

17. The method of claim 13, further comprising exposing a surface of said placeholder material in the presence of said contact element.

18. The method of claim 13, wherein performing said common removal process in the presence of said sacrificial fill material so as to expose a surface of a placeholder material comprises the application of well-known established polishing recipes.

19. The method of claim 1, wherein said sacrificial fill material provides similar removal conditions compared to silicon dioxide and silicon nitride enabling the application of well-known established polishing recipes.

20. The method of claim 13, wherein said sacrificial fill material provides similar removal conditions compared to silicon dioxide and silicon nitride enabling the application of well-known established polishing recipes.

* * * * *